United States Patent
Okumura et al.

(10) Patent No.: US 7,176,402 B2
(45) Date of Patent: Feb. 13, 2007

(54) METHOD AND APPARATUS FOR PROCESSING ELECTRONIC PARTS

(75) Inventors: Tomohiro Okumura, Kadoma (JP); Kenichiro Suetsugu, Nishinomiya (JP); Hiroshi Kawazoe, Hirakata (JP); Mitsuo Saitoh, Neyagawa (JP); Akio Furusawa, Katano (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/969,274

(22) Filed: Oct. 21, 2004

(65) Prior Publication Data
US 2005/0179171 A1 Aug. 18, 2005

(30) Foreign Application Priority Data
Oct. 23, 2003 (JP) .............................. 2003-363081

(51) Int. Cl.
*B23K 10/00* (2006.01)
(52) U.S. Cl. .............................. 219/121.41; 219/121.4; 219/121.59; 219/121.48; 156/345.43; 315/111.21
(58) Field of Classification Search ............. 219/121.4, 219/121.41, 121.43, 121.44, 121.59, 121.48; 156/345.28, 345.43; 315/111.21
See application file for complete search history.

(56) References Cited

U.S. PATENT DOCUMENTS

| 4,806,199 | A | * | 2/1989 | Gualandris | 438/712 |
| 5,201,903 | A | * | 4/1993 | Corbett et al. | 29/872 |
| 5,298,715 | A | * | 3/1994 | Chalco et al. | 219/121.64 |
| 6,500,760 | B1 | * | 12/2002 | Peterson et al. | 438/684 |
| 6,525,481 | B1 | * | 2/2003 | Klima et al. | 315/111.21 |

FOREIGN PATENT DOCUMENTS

| JP | 2000-357865 | 12/2000 |
| JP | 2002-028597 | 1/2002 |

OTHER PUBLICATIONS

Tomohiro Okumura, et al., "Atmospheric Pressure Plasma Treatment and Non-Flux Lead-Free-Soldering of Cu Wire and Strand.", The Japan Institute of Metals, Materials Transactions, vol. 47, No. 3, (2006), pp. 1-7.

* cited by examiner

*Primary Examiner*—Mark Paschall
(74) *Attorney, Agent, or Firm*—Wenderoth, Lind & Ponack, L.L.P.

(57) ABSTRACT

An electronic part processing method for peeling off a resin coating of an electronic part having a terminal section. The method includes a step of irradiating, with plasma, a coated wire having copper as a principal constituent and a surface coated with a resin.

16 Claims, 18 Drawing Sheets

METHOD AND APPARATUS FOR PROCESSING ELECTRONIC PARTS

BACKGROUND OF THE INVENTION (1) Field of the Invention

The present invention relates to a processing method and a processing apparatus for electronic parts.

(2) Description of the Related Art

The flow method using solder reflow is a widely known method for soldering electronic parts on a printed circuit board. As a typical example of electronic parts, a method for soldering a coil shall be explained.

FIG. 1 shows an outline diagram of a coil 1. The coil 1 is made of a coil bobbin 2, a coil section 3, and sections 4 which serve as terminal sections after undergoing a subsequent process. The coil section 3 is wound around the bobbin 2 by using a coil winder, or the like. In general, a conductor wire making up the coil section 3 is a coated wire in which the surface of a wire rod having copper as a principal constituent is coated with a resin. Polyurethanes, imides, polyesters, and the like, are used as the resin, and the coated wire is commonly referred to as enamel wire.

As shown in FIG. 2, solder plating 36 are formed on the terminals. This process shall be discussed in detail later.

As shown in FIG. 3, such a coil is mounted on a printed circuit board 20. The terminal section is inserted in a through-hole provided in the printed circuit board 20, and by processing with a solder reflow apparatus, the solder plating 36 of the terminal section and a land 21 are soldered together. The solder reflow apparatus shall be discussed later.

The process for plating the terminal with solder shall be explained with reference to FIG. 4 to FIG. 8. As shown in FIG. 4, the section 4 which serves as the terminal section takes the form of a coated wire in which the surface of a wire rod 9 having copper as a principal constituent is coated with a resin 10. Furthermore, a leaded solder 38 (lead content 95%) is prepared in a molten state (400° C.) inside a solder plating tank 37. Next, as shown in FIG. 5, by immersing the section which serves as the terminal section into the solder plating tank 37, the coating resin 10 peels off due to heat and turns into enamel particles 39 which melt in the solder 38. Next, as shown in FIG. 6, when the section which serves as the terminal section is lifted out of the solder plating tank 37, the solder plating 36 bonds onto the terminal section.

As another form of a coil, there exists a coil having terminal posts. FIG. 7 shows an outline diagram of such a coil. Coil wire is wound around a coil bobbin 2 to form a coil section 3. A section 41 serving as a terminal section is wound a number of times around a terminal post 40 protruding from the coil bobbin 2. When the terminal post 40 is immersed in the solder plating tank, in a plating process such as that discussed using FIG. 4 to FIG. 6, solder plating bonds to the terminal post 40. FIG. 8 shows a cross-section of the terminal post 40 onto which solder plating has bonded. The solder plating bonds onto the periphery of the terminal post 40, and the wire rod 9 whose resin coating has been removed is integrated with the terminal post 40 via the solder plating 36.

Next, the operation of the solder reflow apparatus shall be discussed with reference to FIG. 19.

A commonly known solder reflow apparatus solders by conveying, in a predetermined direction, a board on which surface mount components without leads and discreet components with leads are placed together, while supplying such a board with molten solder shot out from a nozzle. In this type of solder reflow apparatus, the following are sequentially placed along a board conveyance direction A: a flux application apparatus 23 for applying flux onto the board 20 and a part to be soldered; a preheating apparatus 24 made of a panel heater, or the like, for preheating the part to be soldered and the board 20 in order to properly dry the flux; and a molten solder supply unit 25 for supplying molten solder onto the board 20 and the part to be soldered. The board 20 is conveyed by a conveyor 26 which holds both sides of the board 20 firmly in place and accompanies the board 20 along a conveyor path 27.

The molten solder supply unit 25 includes a primary jet nozzle 28 for properly supplying molten solder onto the entire soldering surface of the board 20 that is placed with an electronic part, and a secondary jet nozzle 29 for removing excess molten solder from the solder supplied board 20. The jet nozzles 28 and 29 are immersed within a solder dip tank 30 filled with molten solder. This type of solder reflow apparatus is explained in detail in Japanese Laid-Open Patent Application No. 2000-357865 Publication.

At the same time, plasma cleaning technology for cleaning a terminal section of a device has come into recent use. An example of this is discussed in Japanese Laid-Open Patent Application No. 2002-28597 Publication. Japanese Laid-Open Patent Application No. 2002-28597 Publication discusses the case where the terminal section of a liquid crystal display device is processed. FIG. 9 shows a liquid crystal display 42 which is made by joining a pair of boards 43 made of a transparent glass sheet or plastic film placed one on top of the other, via a frame-shaped sealant (not shown), and enclosing liquid crystal within the space enclosed by both boards 43 and the sealant. One edge of one board 43 protrudes outside one edge of the other board 43, and the inner surface of this protruding portion serves as a terminal section 44 where a terminal 45, which is made of a plurality of transparent conductive films such as ITO, is laid out. In the terminal section 44, for example, flexibly structured drive circuit boards are joined via an anisotropic conductive adhesive. During this time, if the terminal section 44 is contaminated with a foreign substance such as dust or residue, a defective mechanical attachment or defective electrical connection arises in the joint.

Accordingly, by using a plasma irradiator 46 to irradiate the surface of the terminal section 44 with a stream of gas which is converted to plasma, cleaning is carried out either by blowing off the foreign substance adhering to the surface of the terminal section 44, or by weakening the chemical bonding strength acting in the foreign substance and separating the foreign substance from the surface, or by chemically decomposing the foreign substance per se and eliminating it from the surface of the terminal section 44. The plasma irradiator 46 is made of a nozzle cylinder 47 serving as an anode, and a torch (not shown) serving as a cathode, provided within the nozzle cylinder 47. The head of the nozzle cylinder 47 is a tapered-tip irradiation port 47a. During cleaning, an arc discharge arises between the anode nozzle cylinder 47 and the cathode torch while a reaction gas such as air (atmospheric air), nitrogen gas ($N_2$), or argon (Ar) is supplied in the nozzle cylinder 47. Accordingly, the reaction gas inside the nozzle cylinder 47 is heated and ionized to become ions and electrons forming the plasma state. The reaction gas that has been converted to plasma irradiates the surface of the terminal section 44 by being jetted out as a plasma jet 48 from the nozzle cylinder's 47 irradiation port 47a, which has a spot diameter of 5 mm. At this time, a liquid crystal display device 42 is, for example, placed on a moving table 49, and the plasma irradiator 46 is maintained on a fixed position above the moving table 49. The plasma jet 48 is jetted out onto the surface of the terminal section 44 from the irradiation port 47a of the nozzle cylinder 47, while the moving table 49 is moved together with the liquid crystal display device 42, at a fixed speed along a lengthwise direction of the terminal section 44. With this, the contaminants are removed and the entire surface of the terminal section 44 is cleaned up to a clean state by sequentially applying the plasma jet 48 to all the areas of the surface of the terminal section 44 and blowing off the contaminants in these areas, or weakening the chemical bonding strength acting in the contaminant and thereby separating it from the surface, or chemically decomposing the contaminant per se.

Subsequently, a circuit board is bonded on top of the terminal section 44 via an anisotropic conductive adhesive. As the surface of the terminal section 44 is in a clean state in which contaminants have been removed, it is possible to maintain a satisfactory bonding condition and bond the circuit board to the terminal section 44.

However, the problem of not being able to handle lead-free soldering, in consideration of the environment, exists in the conventional example of electronic parts processing.

In the solder plating process for the terminal section explained with reference to FIG. 4 to FIG. 8, when leaded solder is replaced with lead-free solder, the solder cannot be plated properly onto the terminal section. Compared with leaded solder, the melting point of lead-free solder is high, and a high temperature is needed to maintain molten lead-free solder in the solder plating tank. Furthermore, lead, which makes mixed crystallization with copper easy, is not included. Accordingly, although the coating resin peels off when the coated wire of the section serving as a terminal section is immersed in the molten solder, the wire rod oxidizes and the solder does not bond to the wire rod. Alternatively, in the case of a small wire diameter of $\phi 0.1$ mm or less, the portion from which the resin has been peeled breaks off due to thermal stress generated in the wire rod, and the section serving as the terminal section, as a matter of fact, dissipates in the solder plating tank.

Due to these circumstances, processing using leaded solder is unavoidably carried out on the terminal section of the coil. However, in this case, the lead from the leaded solder of the terminal section melts into the solder dip tank in the solder reflow apparatus which solders coils onto printed circuit boards, and the lead content in the solder within the solder dip tank gradually increases. In the lead-free soldering process, there is a need to manage the lead content in the solder which is used. Generally, a standard of less than 1% is used, with standards such as less than 0.3% and less than 0.2% being used in stricter operations.

However, when lead mixes in, as described above, it is necessary to maintain the management standard for lead content by totally replacing the solder in the solder dip tank every few days or weeks of operating the solder reflow apparatus, thereby posing a big burden.

Moreover, the plasma cleaning technology introduced in Japanese Laid-Open Patent Application No. 2002-28597 Publication is, first and foremost, a processing technology for cleaning a terminal section which is an exposed conductive section, and absolutely no discussion is made regarding the handling of lead-free solders.

In view of the existing problem, the objects of the present invention are to provide electronic parts having a terminal section plated with lead-free solder, a processing method and processing apparatus for plating lead-free solder onto the terminal section of an electronic part, and a processing method and processing apparatus for adapting an electronic part to a lead-free soldering process.

SUMMARY OF THE INVENTION

The electronic part processing method according to a first invention is an electronic part processing method for peeling off a resin coating of an electronic part having a terminal section. The method includes irradiating a coated wire with plasma, where the coated wire has copper as a principal constituent and a surface that is coated with a resin.

According to this structure, plating of lead-free solder without flux also becomes possible, as the resin coating can be removed from the terminal section at a high speed and the surface of the exposed copper is not oxidized.

In the electronic part processing method in the first invention, it is preferable that the plasma of a gas including an inert gas is irradiated.

There is the advantage that discharging in inert gas is easier at about atmospheric pressure.

It is preferable that the gas is a mixed gas further including at least one of oxygen and fluorine.

According to this structure, combining gas which includes oxygen or fluorine ($CF_4$, $SF_6$, and the like) has the advantage of enabling the removal of the resin coating from the terminal section at higher speeds.

Furthermore, it is preferable that a percentage of the inert gas included in the gas is from 90% to 99.9%.

Furthermore, it is preferable that the inert gas includes helium gas.

Furthermore, it is preferable that the fluorine is included as at least one of $CF_4$ and $SF_6$ gases.

Furthermore, it is preferable that the plasma is irradiated under atmospheric pressure.

In addition, it is preferable that in the irradiating of the coated wire with the plasma, the plasma is generated by supplying electric power between two electrodes, where the electrodes are located opposite each other across a dielectric cylinder.

In addition, it is preferable that in the irradiating of the coated wire with the plasma, the plasma is generated by using a two-layered dielectric cylinder made of an inner cylinder and an outer cylinder which are separated by a space, in which the inert gas is supplied from one of the inner cylinder and the outer cylinder, the gas including at least one of oxygen and fluorine is supplied from the other of the inner cylinder and the outer cylinder, and electric power is supplied between two electrodes located on opposite sides of the outer cylinder.

According to this structure, plating of lead-free solder without flux also becomes possible, as the resin coating can be removed from the terminal section at a high speed and the surface of the exposed copper is not oxidized.

In addition, it is preferable that the percentage of the inert gas within a total of the gases supplied from the inner cylinder and the outer cylinder is from 20% to 80%.

Furthermore, it is preferable that the electronic part processing method further includes: cutting-off a wire rod at a portion from which the resin coating has been peeled off by irradiation with the plasma; and forming a coil by winding the coated wire including the cut-off wire rod, into a predetermined shape.

Furthermore, it is preferable that the electronic part processing method further includes forming the terminal section by plating solder onto a portion from which the resin coating has been peeled off by irradiation with the plasma, where the solder has less than 1% lead content.

Furthermore, the electronic part processing method may further include applying flux onto the portion from which the resin coating has been peeled off by irradiation with the plasma.

Furthermore, it is preferable that the electronic part processing method further includes: inserting the terminal section of the electronic part into a printed circuit board; and soldering the terminal section of the electronic part onto the printed circuit board by processing the printed circuit board on a solder reflow apparatus.

In addition, it is preferable that the solder reflow apparatus shoots the solder onto the printed circuit board, where the solder has less than 1% lead content.

The electronic part processing apparatus according to a second invention is an electronic part processing apparatus for peeling off a resin coating of an electronic part having a terminal section. The electronic part processing apparatus includes: a microplasma source operable to generate plasma locally; a gas supply apparatus operable to supply gas to the microplasma source; a power source operable to supply electric power to the microplasma source; and a coil winder operable to form a coil by winding a coated wire into a predetermined shape. It is preferable that the microplasma sources includes a cylinder having a cylinder diameter of 0.3 mm to 3 mm, inclusive.

According to this structure, plating of lead-free solder without flux also becomes possible, as the resin coating can be removed from the terminal section at a high speed and the surface of the exposed copper is not oxidized.

The electronic part in the second invention is an electronic part having a terminal section made of a wire rod having copper as a principal constituent. The electronic part includes: a thin fluorine-inclusive layer formed on a surface of the terminal section; and a solder plating layer having less than 1% lead content, where the solder plating layer is formed on the fluorine-inclusive layer.

According to this structure, even when the terminal section is plated with a lead-free solder having poor wettability, it is possible to provide an electronic part placed on the surface of the terminal section, with the solder plate layer having good adhesiveness due to the fluorine-inclusive layer.

DETAILED DESCRIPTION OF THE PREFERRED EMBODIMENTS

First Embodiment

Hereinafter, the first embodiment of the present invention shall be explained with reference to FIG. 10 to FIG. 20

Figure 1:
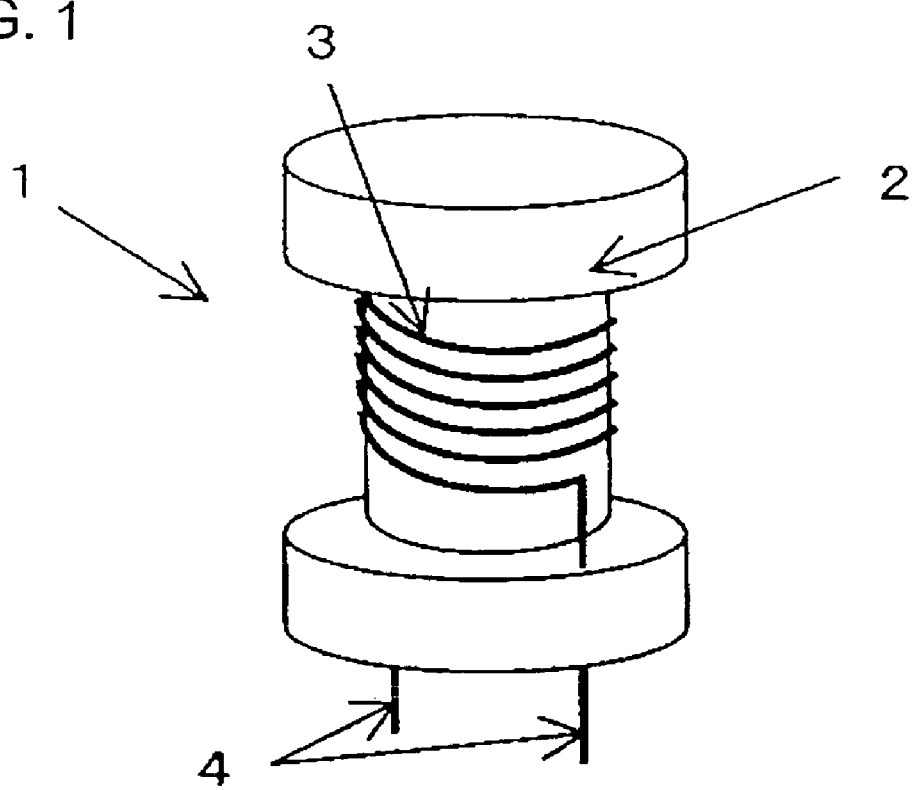
FIG. 1 is a perspective diagram showing the appearance of a coil.
Figure 2:
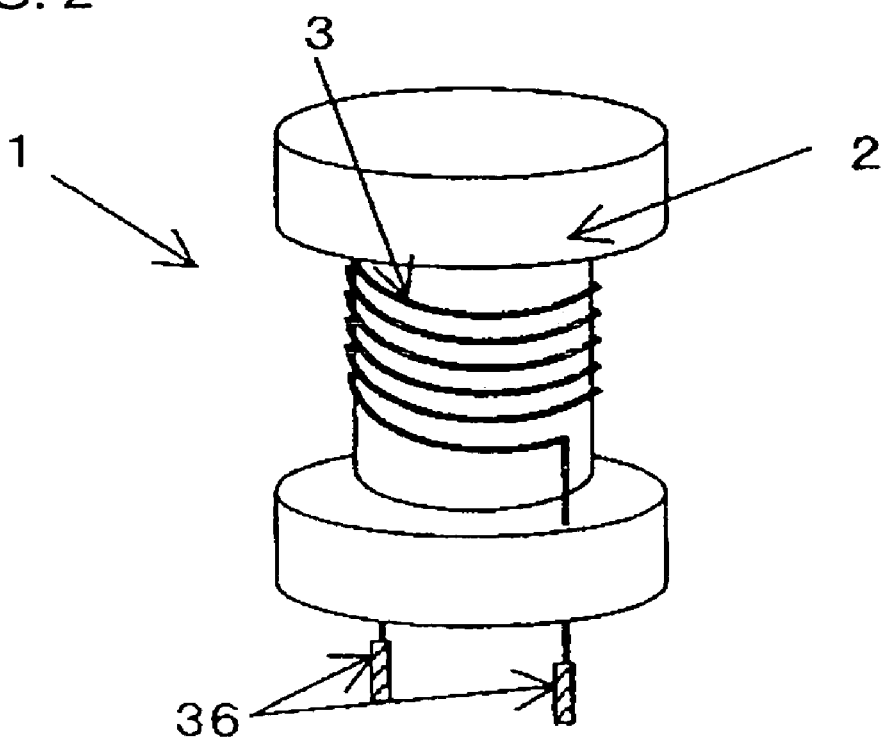
FIG. 2 is a perspective diagram showing the appearance of a coil with processed terminals.
Figure 3:
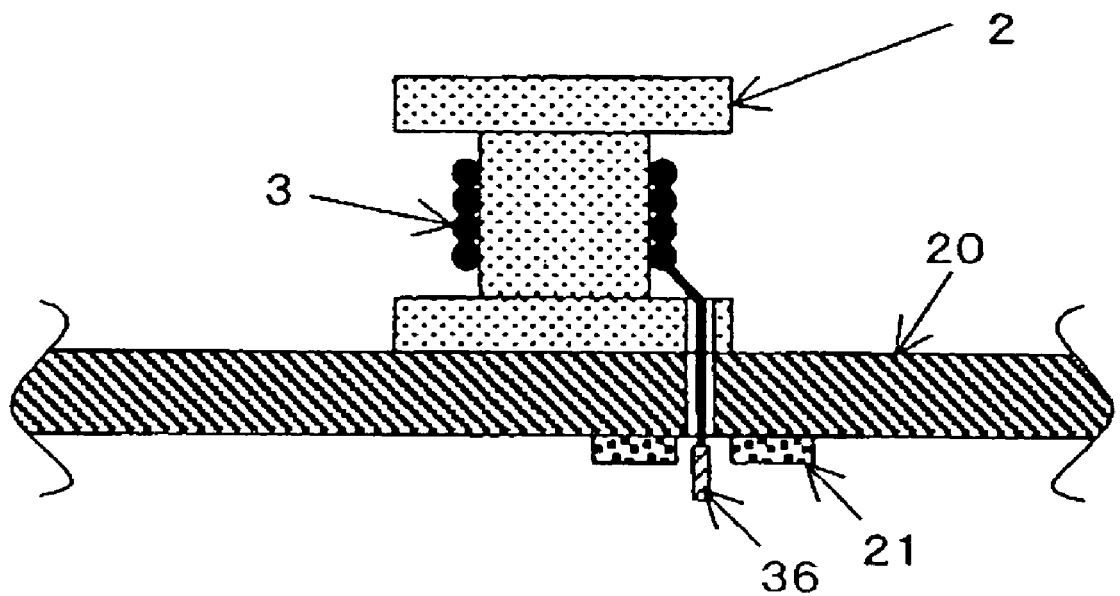
FIG. 3 is a cross-section diagram showing the appearance of the coil as mounted onto the printed circuit board.
Figure 4:
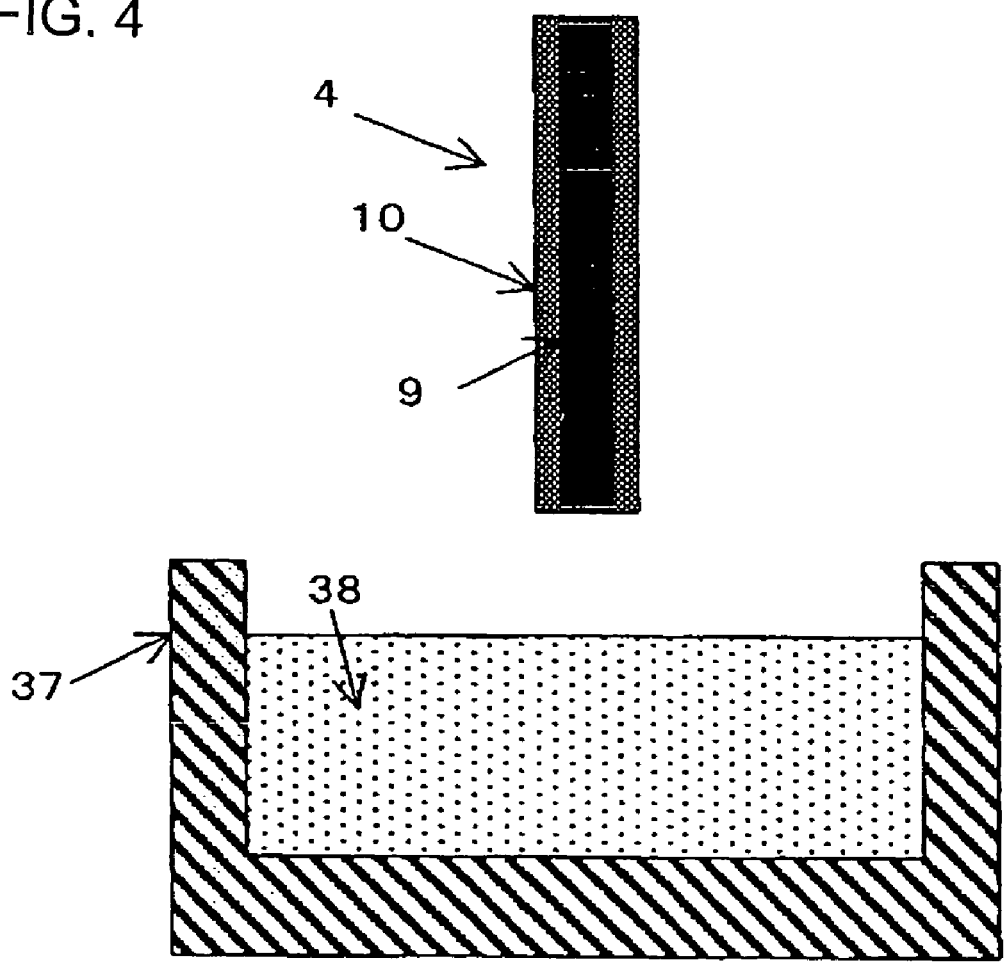
FIG. 4 is a cross-section diagram showing the appearance of the section serving as the terminal section as being moved close to the solder plating tank, in the conventional example.
Figure 5:
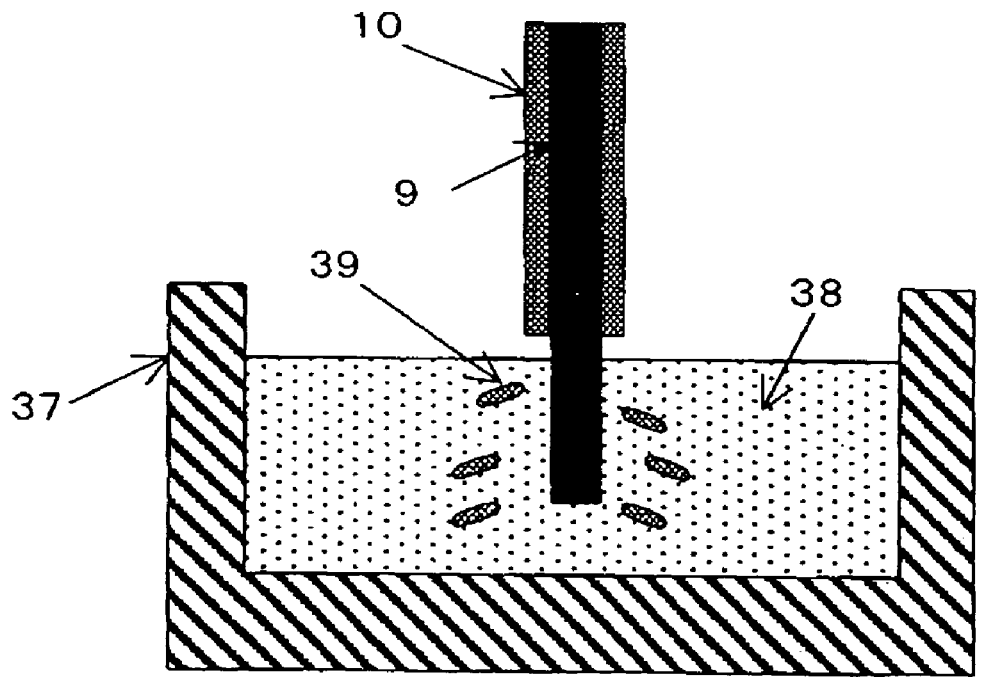
FIG. 5 is a cross-section diagram showing the appearance of the section serving as the terminal section being dipped in the solder plating tank, in the conventional example.
Figure 6:
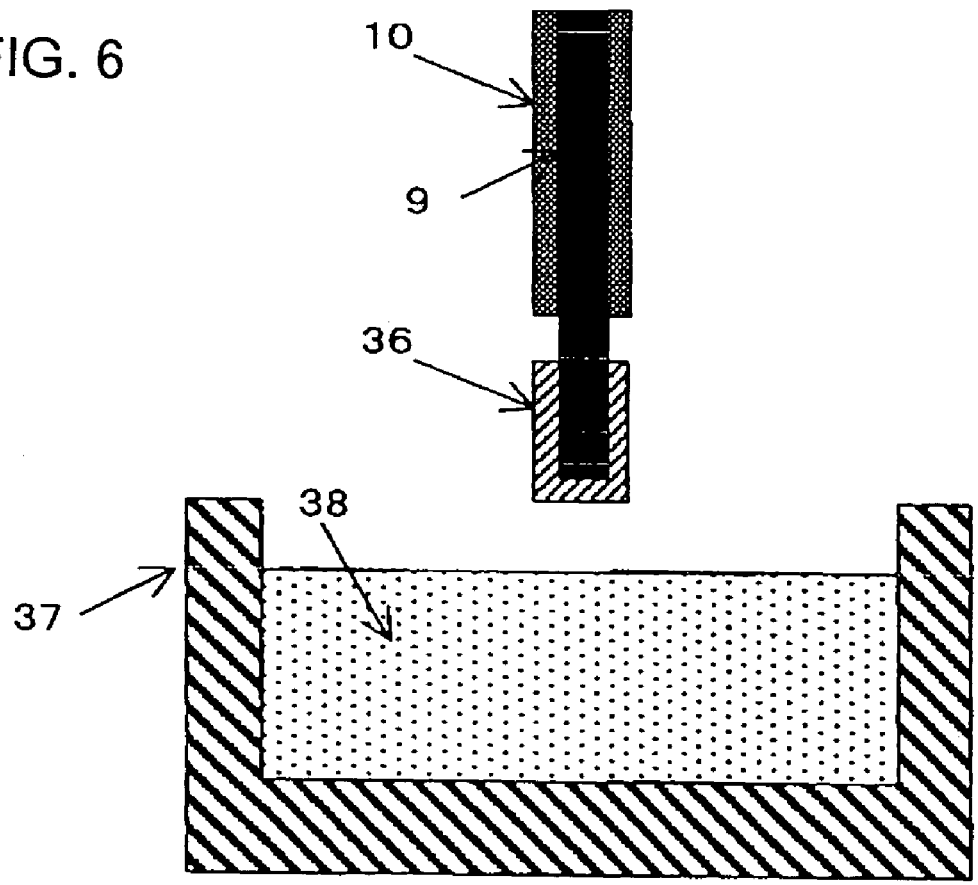
FIG. 6 is a cross-section diagram showing the appearance of the section serving as the terminal section being drawn out from the solder plating tank, in the conventional example.
Figure 7:
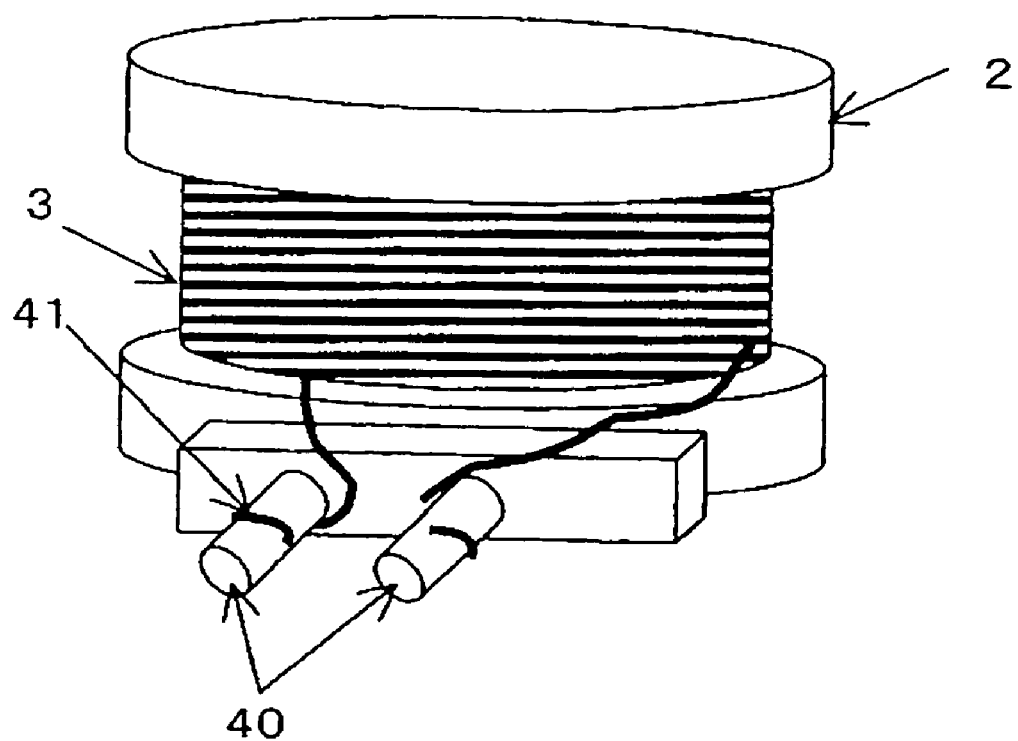
FIG. 7 is a perspective diagram of the appearance of a coil having terminal posts.
Figure 8:
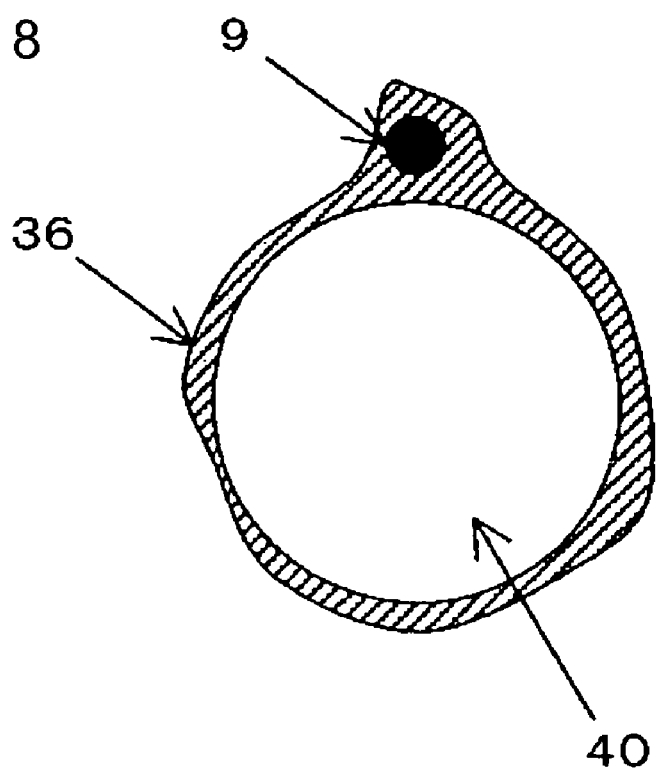
FIG. 8 is a cross-section diagram of a terminal post onto which solder plating has bonded.
Figure 9:
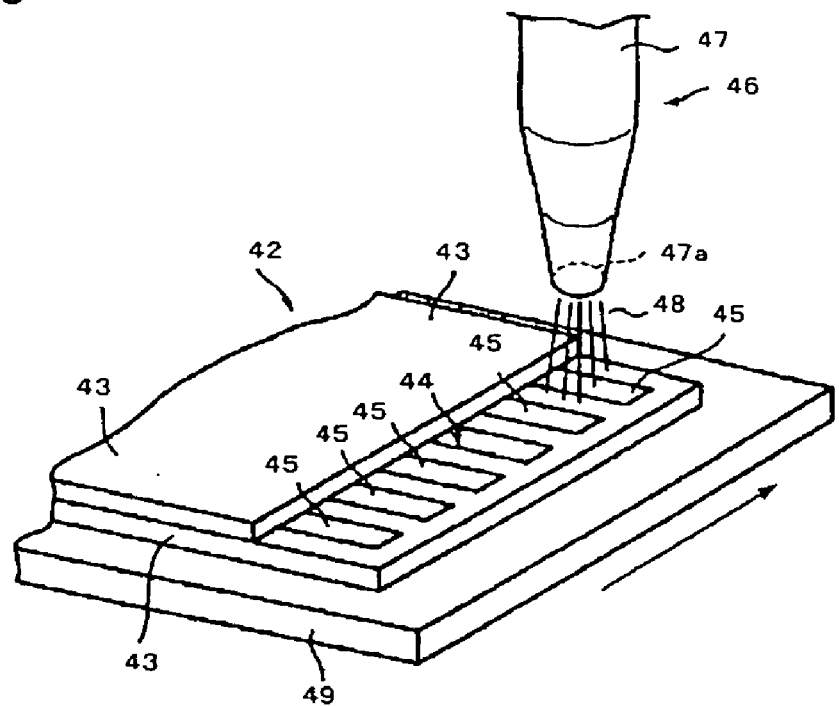
FIG. 9 is a perspective diagram showing the outline structure of a plasma cleaning apparatus.
Figure 10:
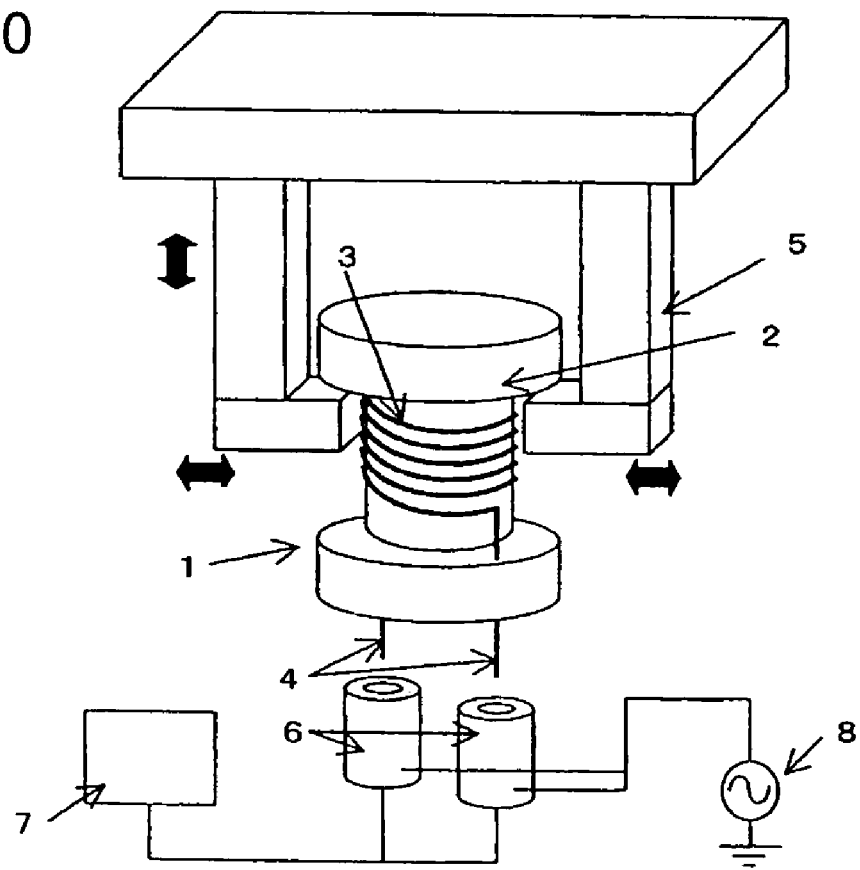
FIG. 10 is a perspective diagram showing the outline structure of a microplasma processing apparatus according to the present invention.

FIG. 10 is a perspective diagram showing the outline structure of a microplasma processing apparatus which is an electronic part processing apparatus for removing a resin coating of a section which serves as a terminal. In FIG. 10, a coil 1 includes a coil bobbin 2, a coil section 3, and sections 4 which serve as terminal sections after undergoing a later process. By using a coil winder, or the like, a conductor wire making up the coil section 3 is wound around the coil bobbin 2. In general, the conductor wire making up the coil section 3 is a coated wire in which the surface of a wire rod having copper as a principal constituent is coated with a resin. The conductor wire is generally referred to as an enamel wire.

A handler 5 handling a coil 1, as an electronic part, has a mobile configuration as indicated by the arrows in FIG. 10, and can move up and down while grasping the coil 1.

Each microplasma source 6 is connected to a gas supply apparatus 7 and a power source 8, and can generate plasma locally.

Figure 11:
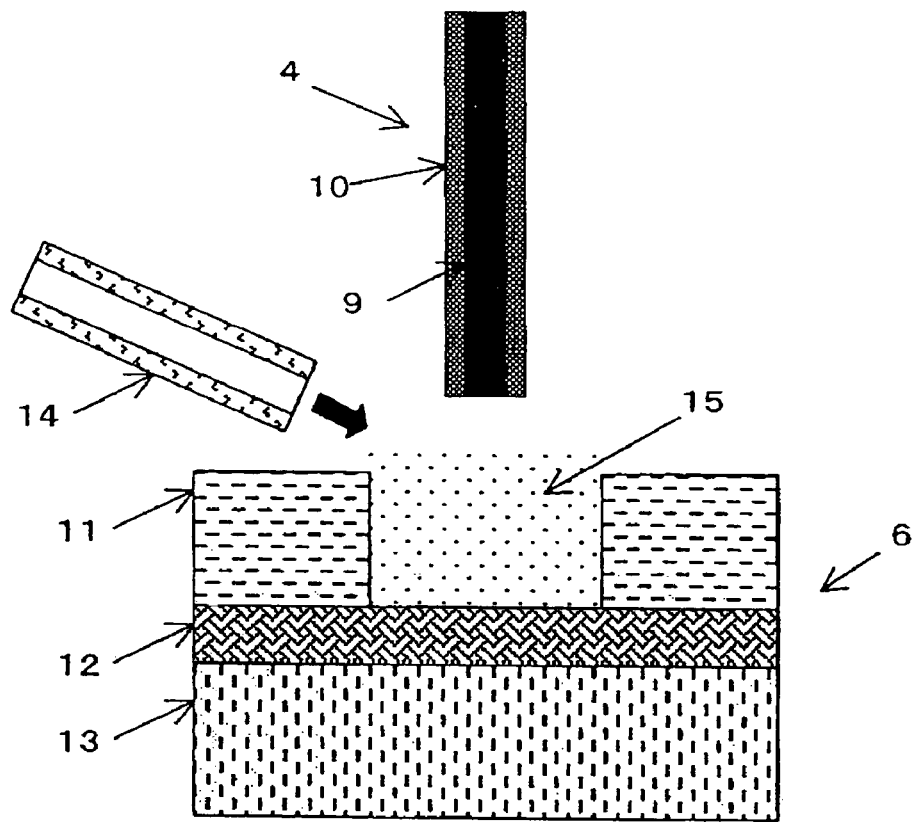
FIG. 11 is a cross-section diagram of the microplasma source and the section serving as the terminal section.

FIG. 11 is a cross-section diagram of a microplasma source 6 and a section 4 which serves as a terminal section.

Prior to plating, the section 4 which serves as a terminal section assumes the form of a coated wire in which the surface of a wire rod 9 having copper as a principal constituent is coated by a resin 10. The microplasma source 6 includes a first electrode 11 provided with a through-hole, a dielectric 12, a second electrode 13, and a gas nozzle 14. By impressing voltage between the first electrode 11 and the second electrode 13, plasma 15 is generated within the through-hole provided in the first electrode 11.

The voltage impressed between the first electrode 11 and the second electrode 13 can be a high frequency voltage of several hundred kHz to several GHz, a voltage having pulse modulated high frequency waves, or a pulsed direct current voltage. As there is a danger that the wire rod 9 will melt/scatter and dissipate when an arc discharge arises between the first electrode 11 and the wire rod 9, it is preferable to impress a high voltage on the second electrode 13, and ground the first electrode 11.

The plasma which is generated can be the plasma of a gas consisting primarily of an inert gas, or the plasma of a gas which mixes a gas including oxygen or fluorine ($CF_4$, $SF_6$, and the like) into an inert gas.

Furthermore, although such a plasma source can operate from several Pa up to several atmospheres, the plasma typically operates with a pressure ranging from about 10,000 Pa to 3 atmospheres. In particular, operation near atmospheric pressure is especially preferable as a tightly sealed structure and a special exhaust apparatus is not required, and diffusion of plasma and active particles is reasonably suppressed.

Figure 12:
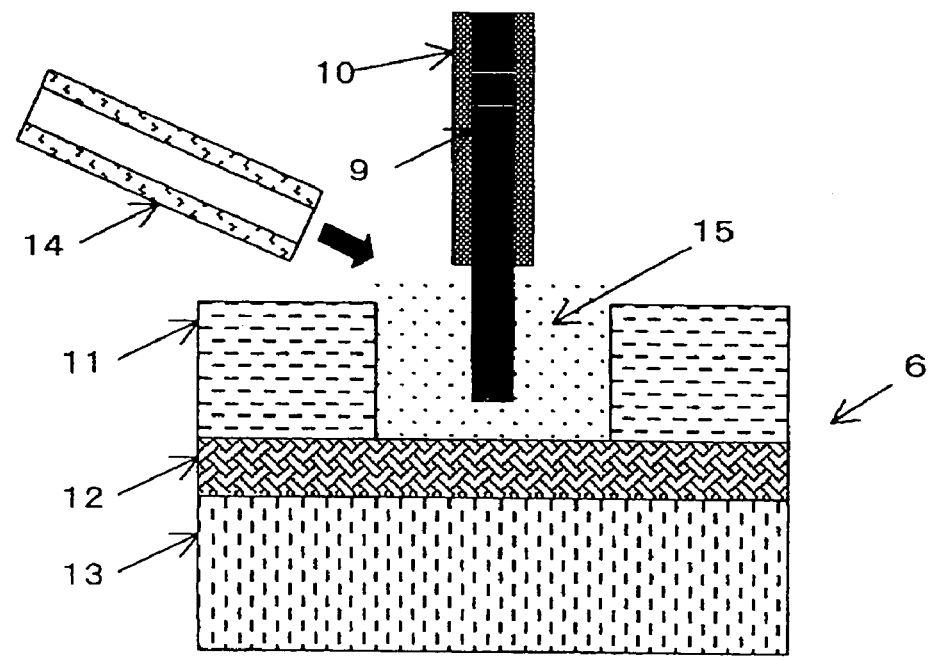
FIG. 12 is a cross-section diagram showing the appearance of the section serving as the terminal section being irradiated with plasma.

FIG. 12 is a cross section diagram showing the appearance of the section 4 which serves as the terminal section being irradiated.

By operating the handler 5, the section 4 serving as the terminal section is inserted into the plasma 15, and is irradiated with the plasma 15. At which point, the active particles within the plasma react with and vaporize the coating resin 10, exposing the wire rod 9 at the tip of the section serving as the terminal section.

Although there is the advantage of discharging easily in inert gases at around atmospheric pressure, mixing a gas including oxygen or fluorine ($CF_4$, $SF_6$, and the like) has an advantage of enabling fast processing. A gas including fluorine disassociates in the plasma, giving rise to fluorine radicals. When a gas including fluorine is supplied, the coat-peeling process can be carried out significantly faster as compared to when a gas including fluorine is not supplied, as fluorine radicals produce the effect of making the extraction of H atoms easier when $CO_2$ and $H_2O$ are created by the reaction of oxygen radicals with the C and H atoms making up the coating material. However, as gases including fluorine are expensive as compared to inert gases such as helium, supplying only when the section 4 serving as the terminal section is inserted is also possible. Alternatively, it is also possible to supply gas and generate plasma, after the section 4 serving as the terminal section is inserted.

This type of plasma is referred to as non-equilibrium plasma. Although the temperature of electrons shouldering ionization is high, being in the tens of thousands of degrees Celsius, the temperature of ions and neutral particles is low, being in the hundreds to thousands of degrees Celsius, and there is an advantage of effectively vaporizing only the coating resin with very little thermal/mechanical damage to the wire rod 9. Furthermore, assuming that the terminal section is processed using the plasma cleaning apparatus shown in the conventional example, only the resin on a part of the periphery of the wire rod is removed. Therefore, in the present embodiment, it is significantly better in terms of being able to remove the resin 10 around the entire periphery of the wire rod 9.

Figure 13:
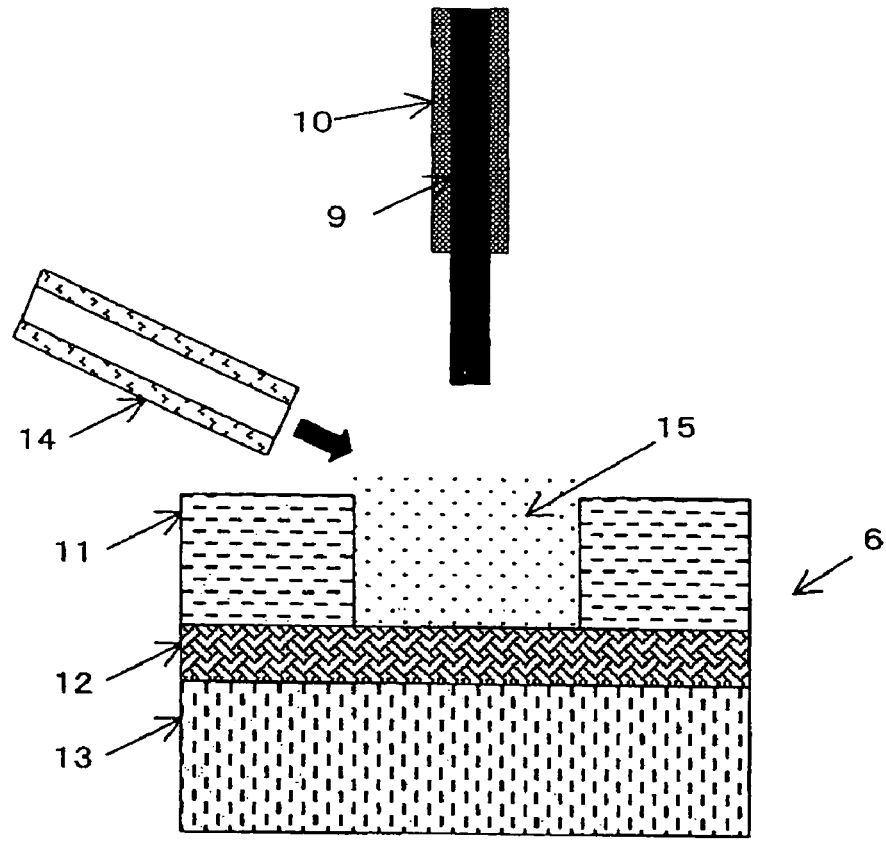
FIG. 13 is a cross-section diagram of the appearance of the section serving as the terminal section being drawn from the microplasma source.

Next, as shown in FIG. 13, the section 4 serving as the terminal section is withdrawn by operating the handler 5. Although dependent on processing conditions such as the material of the wire rod 9, temperature, oxygen and water vapor density, at this time a thin natural oxide film develops on the surface of the exposed wire rod 9. The thickness of this natural oxide film is generally under 100 nm, and is roughly 5 nm to 20 nm. In addition, depending on the conditions, the thickness may be generally under 20 nm, and is roughly 2 nm to 10 nm.

In particular, in the case of processing with plasma that uses a mixed gas of helium and a gas including oxygen and fluorine, in addition to being able to remove the coating resin 10 in a low temperature, a extremely thin, chemically stable fluorine-including layer is formed on the surface of the terminal section from where the covering has been removed. Here, extremely thin means that the thickness of the fluorine-inclusive layer is in the order of 1 nm to 20 nm, and can mean 10 nm and below, depending on the plasma processing condition. With the existence of the fluorine-inclusive layer, the development of oxidation on the surface of the terminal section is suppressed, and there is a big advantage of not requiring flux in the subsequent solder plating process. Not only that, even when the electronic parts that have been plasma processed are left exposed to air for a long time (several days to several weeks, for example), solder plating can be carried out without the need for flux.

Figure 14:
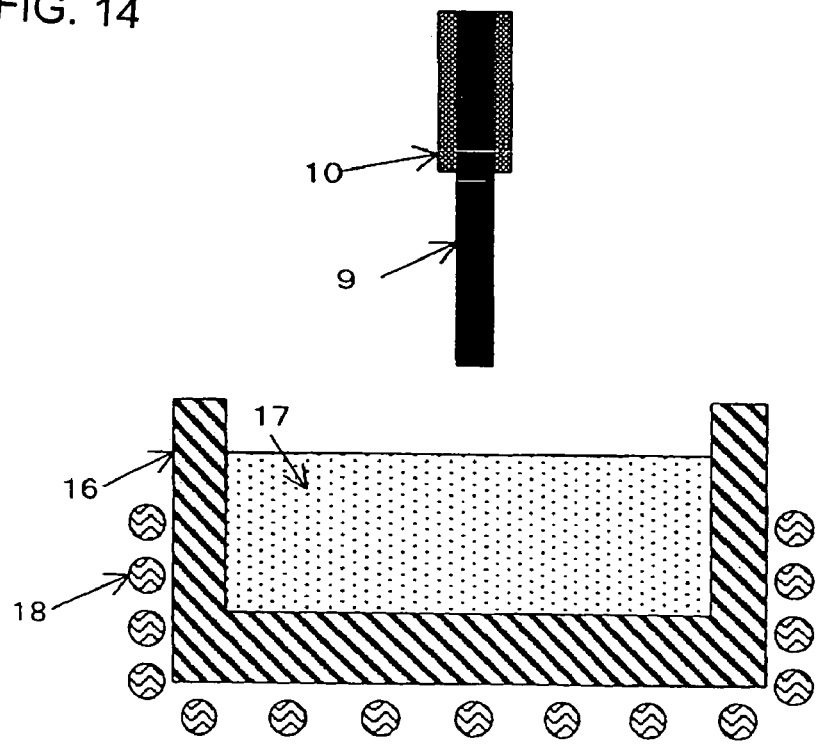
FIG. 14 is a cross-section diagram showing the appearance of the section serving as the terminal section as being moved close to the solder plating tank.

Next, as shown in FIG. 14, the section 4 serving as the terminal section is moved near the solder plating tank 16.

A lead-free solder 17 (lead content 0.1%, tin and copper as principal constituents) in a molten state (260° C. to 300° C.) is prepared inside the solder plating tank 16. A heater 18 for heating the solder plating tank 16 is placed in (along) the periphery of the solder plating tank 16. The temperature is lower than in the solder plating tank for leaded solder as the melting/peeling off of the resin is not required. As such, even with a very thin wire rod, the portion from which the resin has been peeled off does not break off due to thermal stress arising in the wire rod, and the section serving as the terminal section, as a matter of fact, does not dissipate into the solder plating tank.

Figure 15:
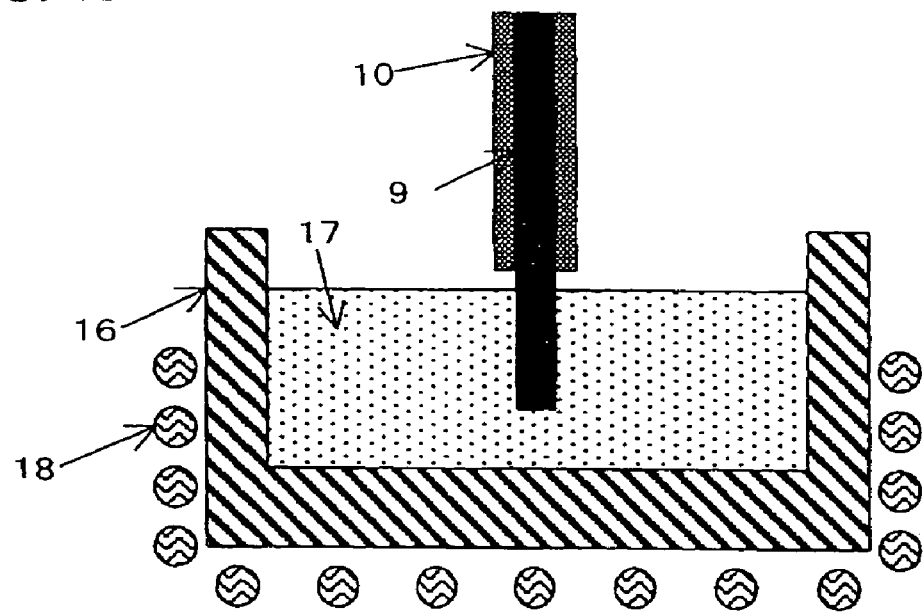
FIG. 15 is a cross-section diagram showing the appearance of the section serving as the terminal section being dipped in the solder plating tank.
Figure 16:
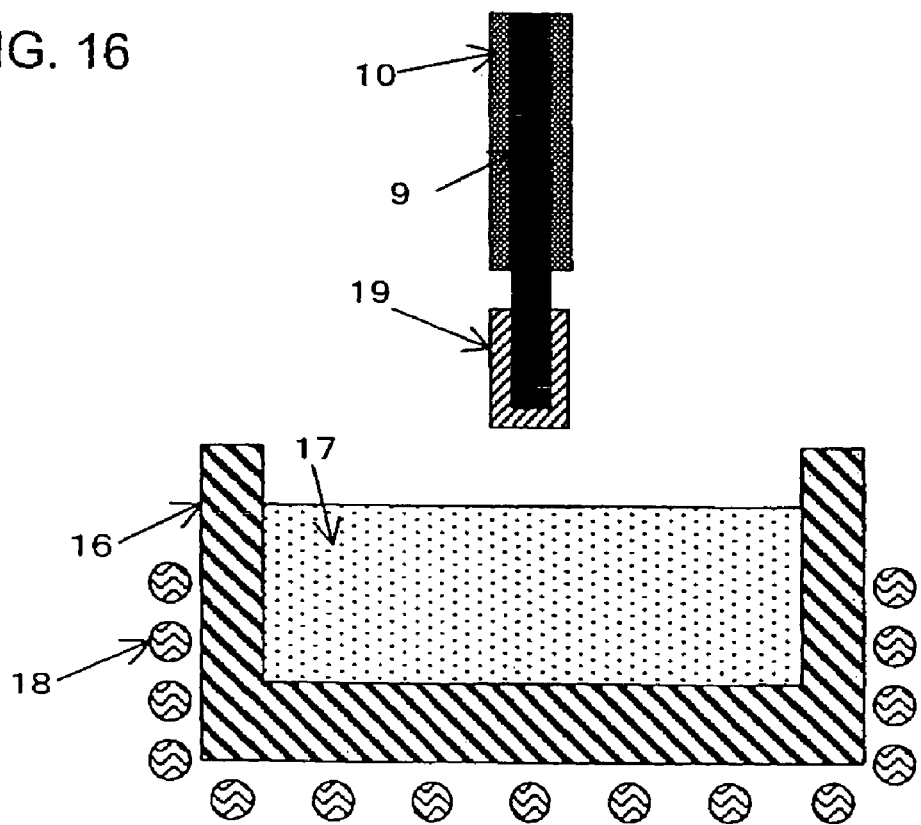
FIG. 16 is a cross-section diagram showing the appearance of the section serving as the terminal section being drawn out from the solder plating tank.

Next, as shown in FIG. 16, when the section serving as the terminal section is withdrawn from the solder plating tank 16 by operating the handler 5, after the section 4 serving as the terminal section is immersed in the solder plating tank 16 by operating the handler 5, as shown in FIG. 15, the lead-free solder bonds a solder plating 19 onto the tip of the wire rod 9.

Figure 17:
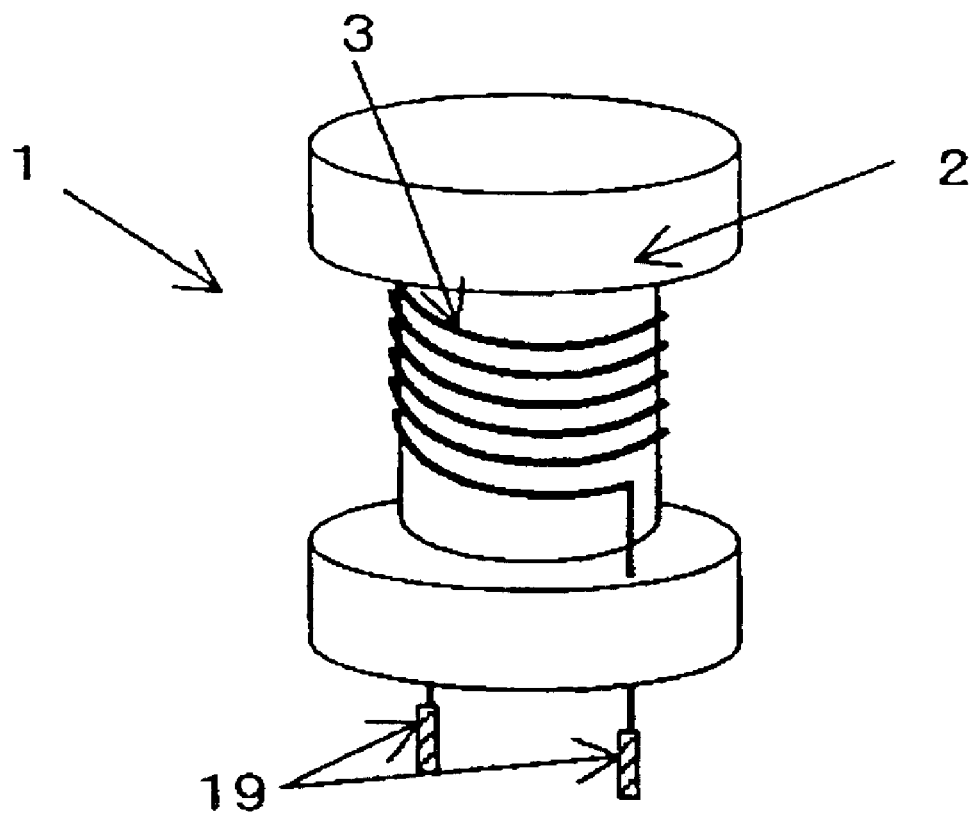
FIG. 17 is a perspective diagram showing the appearance of a coil with processed terminals.

In this manner, the coil 1 having properly processed terminals, as shown in FIG. 17, is completed.

Figure 18:
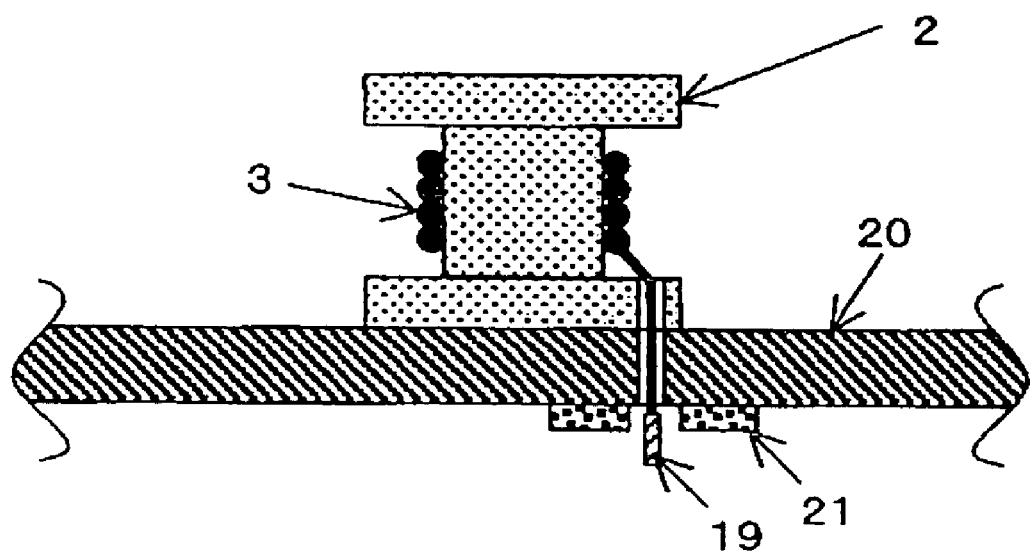
FIG. 18 is a cross-section diagram showing the appearance of the coil as mounted onto the printed circuit board.

Next, as shown in FIG. 18, such a coil is placed onto the printed circuit board 20. The terminal section is inserted through the through-hole provided on the printed circuit board 20.

Figure 19:
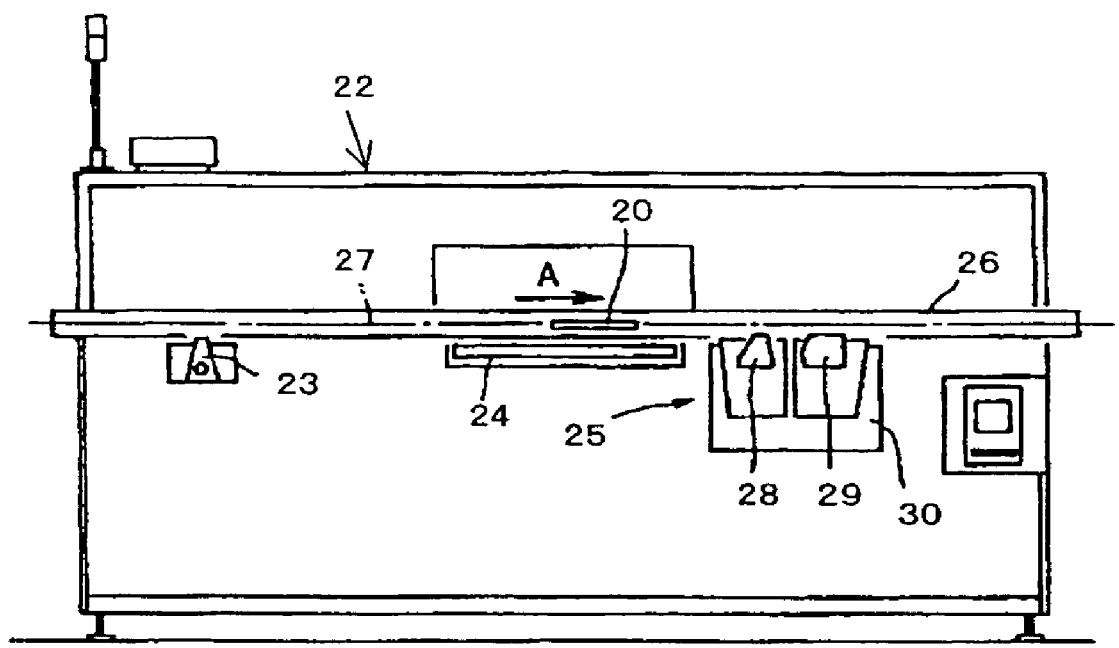
FIG. 19 is a cross-section diagram showing the outline structure of a solder reflow apparatus.
Figure 20:
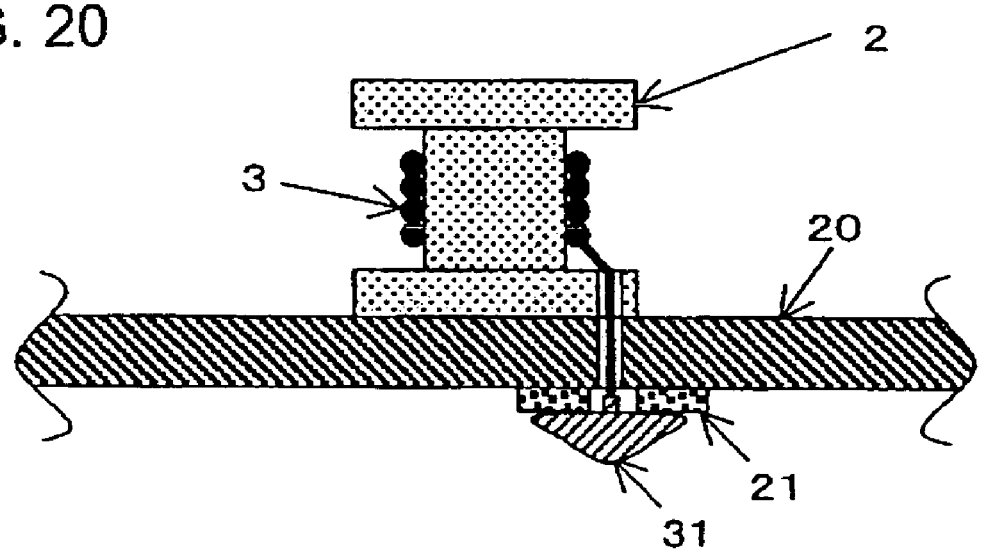
FIG. 20 is a cross-section diagram showing the appearance of the coil after being soldered.

Next, by processing with a lead-free solder reflow apparatus 22 such as that shown in FIG. 19, the terminal section and a land 21 are connected by using a solder 31, and the solder plating process is completed, as shown in FIG. 20.

In FIG. 19, the following are sequentially placed along a board conveyance direction A: a flux application apparatus 23 for applying flux onto the board 20 and a part to be soldered; a preheating apparatus 24 made of a panel heater, or the like, for preheating the part to be soldered and the board 20 in order to properly dry the flux; and a molten solder supply unit 25 for supplying molten solder onto the board 20 and the part to be soldered. The board 20 is conveyed by a conveyor 26 which holds both sides of the board 20 firmly in place and accompanies the board 20 along a conveyor path 27.

The molten solder supply apparatus 25 includes a primary jet nozzle 28 for properly supplying molten solder onto the entire soldering surface of the board 20 placed with an electronic part, and a secondary jet nozzle 29 for removing excess molten solder from the solder supplied board 20. The jet nozzles 28 and 29 are immersed within a solder dip tank 30 filled with molten solder.

Moreover, as discussed earlier, since the natural oxide film becomes very thin as the coating can be removed at a low temperature in the case of processing with plasma which uses a mixed gas of helium and a gas including oxygen and fluorine, there are many cases where flux is not required, and when used in a production line, or the like, with limited product types, there are instances where the flux application apparatus 23 for applying flux onto the board 20 and the part to be soldered, and the preheating apparatus 24 made of a panel heater, or the like, for preheating the part to be soldered and the board 20 in order to properly dry the flux, are not required.

Second Embodiment

Next, the second embodiment of the present invention shall be explained with reference to FIG. 21.

Figure 21:
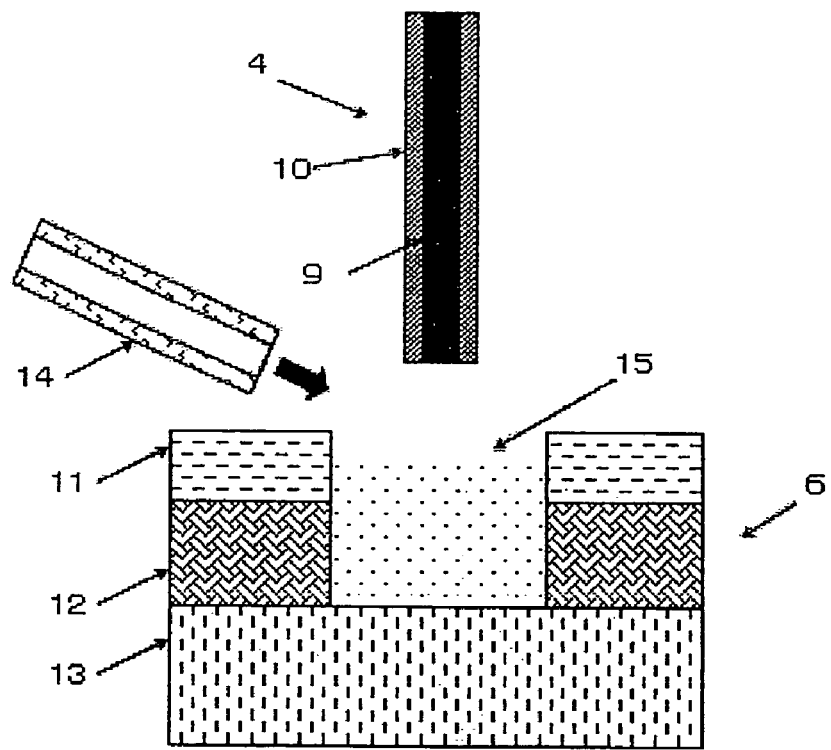
FIG. 21 is a cross-section diagram showing the outline structure of the microplasma source used in the second embodiment of the present invention.

FIG. 21 is a cross section diagram showing an example of a microplasma source for irradiating a terminal section with plasma.

In FIG. 21, prior to plating, a section 4 which serves as a terminal section assumes the form of a coated wire in which the surface of a wire rod 9 having copper as a principal constituent is coated by a resin 10.

A microplasma source 6 includes a first electrode 11 provided with a through-hole, a dielectric 12 provided with a through-hole, a second electrode 13, and a gas nozzle 14.

The through-hole provided in the dielectric 12 is placed virtually coaxially with the through-hole provided in the first electrode 11. By impressing voltage between the first electrode 11 and the second electrode 13, plasma 15 is generated within the through-holes provided in the first electrode 11 and the dielectric 12.

The voltage impressed between the first electrode 11 and the second electrode 13 can be a high frequency voltage of several hundred kHz to several GHz, a voltage having pulse modulated high frequency waves, or a pulsed direct current voltage. As there is a danger that the wire rod 9 will melt/scatter and dissipate when an arc discharge arises between the first electrode 11 and the wire rod 9, it is preferable to impress a high voltage on the second electrode 13, and ground the first electrode 11.

Third Embodiment

Next, the third embodiment of the present invention shall be explained with reference to FIG. 22.

Figure 22:
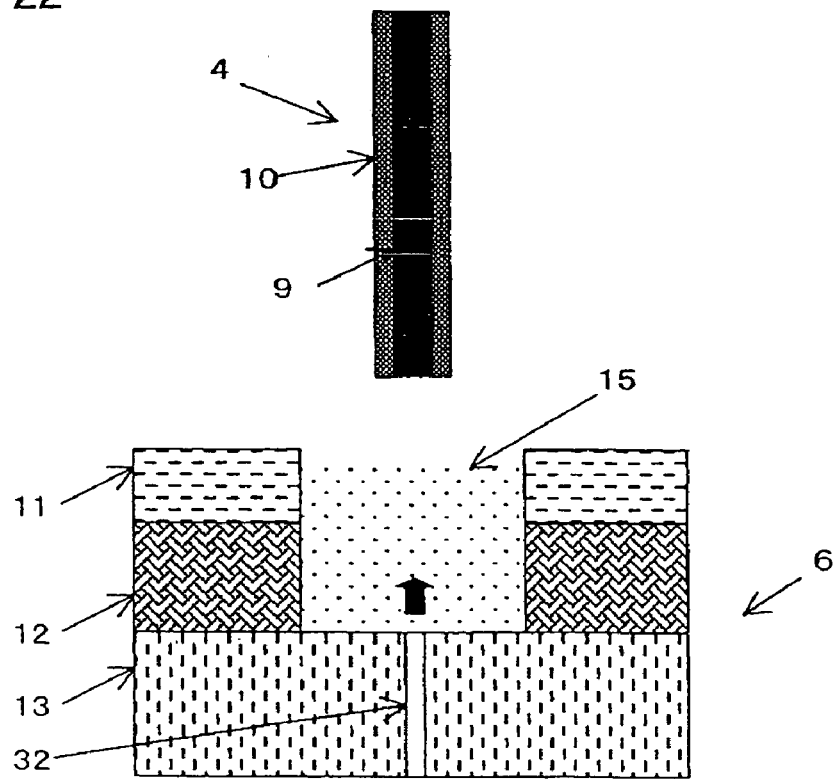
FIG. 22 is a cross-section diagram showing the outline structure of the microplasma source used in the third embodiment of the present invention.

FIG. 22 is a cross-section diagram showing an example of a microplasma source for irradiating a terminal section with plasma.

In FIG. 22, prior to plating, a section 4 which serves as a terminal section assumes the form of a coated wire in which the surface of a wire rod 9 having copper as a principal constituent is coated by a resin 10.

A microplasma source 6 includes a first electrode 11 provided with a through-hole, a dielectric 12 provided with a through-hole, a second electrode 13, and a gas supply hole 32.

The through-hole provided in the dielectric 12 is placed virtually coaxially with the through-hole provided in the first electrode 11.

Gas is supplied from the gas supply hole 32 towards the through-holes provided in the first electrode 11 and the dielectric 12.

By impressing voltage between the first electrode 11 and the second electrode 13, plasma 15 is generated within the through-holes provided in the first electrode 11 and the dielectric 12.

The voltage impressed between the first electrode 11 and the second electrode 13 can be a high frequency voltage of several hundred kHz to several GHz, a voltage having pulse modulated high frequency waves, or a pulsed direct current voltage. As there is a danger that the wire rod 9 will melt/scatter and dissipate when an arc discharge arises between the first electrode 11 and the wire rod 9, it is preferable to impress a high voltage on the second electrode 13, and ground the first electrode 11.

In a structure such as this, there is an advantage of high gas usage efficiency, as all the gas supplied from the gas supply hole 32 passes the space at which plasma is generated.

Fourth Embodiment

Next, the fourth embodiment of the present invention shall be explained with reference to FIG. 23.

Figure 23:
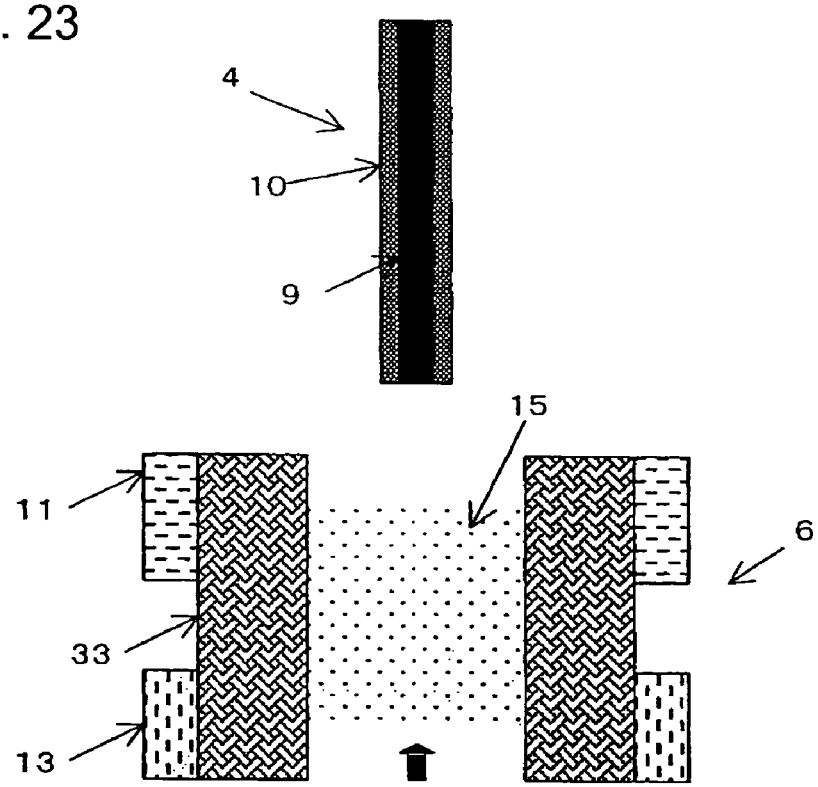
FIG. 23 is a cross-section diagram showing the outline structure of the microplasma source used in the fourth embodiment of the present invention.

FIG. 23 is a cross-section diagram showing an example of a microplasma source for irradiating a terminal section with plasma.

In FIG. 23, prior to plating, a section 4 which serves as a terminal section assumes the form of a coated wire in which the surface of a wire rod 9 having copper as a principal constituent is coated by a resin 10.

A microplasma source 6 includes a dielectric cylinder 33 provided with a through-hole, a first electrode 11 provided near the dielectric cylinder 33, and a second electrode 13 provided near the dielectric cylinder 33. In FIG. 23, gas is supplied within the dielectric cylinder 33 from the bottom towards the top (i.e. towards the first electrode 11).

By impressing voltage between the first electrode 11 and the second electrode 13, plasma 15 is generated within the dielectric cylinder 33. The voltage impressed between the first electrode 11 and the second electrode 13 can be a high frequency voltage of several hundred kHz to several GHz, a voltage having pulse modulated high frequency waves, or a pulsed direct current voltage. As there is a danger that the wire rod 9 will melt/scatter and dissipate when an arc discharge arises between the first electrode 11 and the wire rod 9, it is preferable to impress a high voltage on the second electrode 13, and ground the first electrode 11.

In a structure such as this, there is an advantage of long electrode life, as plasma does not come into contact with the electrodes.

Fifth Embodiment

Next, the fifth embodiment of the present invention shall be explained with reference to FIG. 24.

Figure 24:
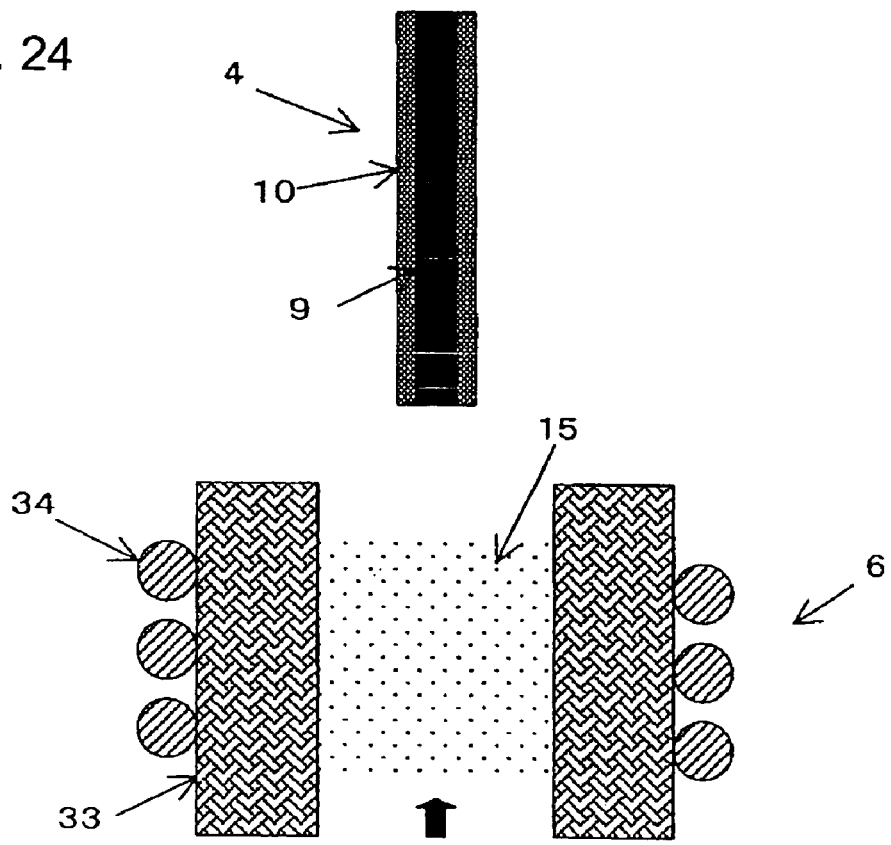
FIG. 24 is a cross-section diagram showing the outline structure of the microplasma source used in the fifth embodiment of the present invention.

FIG. 24 is a cross-section diagram showing an example of a microplasma source for irradiating a terminal section with plasma.

In FIG. 24, prior to plating, a section 4 which serves as a terminal section assumes the form of a coated wire in which the surface of a wire rod 9 having copper as a principal constituent is coated by a resin 10.

A microplasma source 6 includes a dielectric cylinder 33 provided with a through-hole, and a coil 34 provided close to the dielectric cylinder 33 in a manner in which the coil 34 is wound around the outer wall of the dielectric cylinder 33. In FIG. 24, gas is supplied within the dielectric cylinder 33 from the bottom towards the top.

By impressing the coil 34 with a high frequency voltage and circulating a large electric current on the coil 34, inductively coupled plasma is generated within the dielectric cylinder 33. The voltage impressed on the coil 34 can be a high frequency voltage of several hundred kHz to several GHz, a voltage having pulse modulated high frequency waves, or a pulsed direct current voltage. In addition, it is preferable to have a coolant applied on the inside or outside of the coil 34 so that the coil 34 does not heat up.

In a structure such as this, there is an advantage of prolonged plasma source life, as electrodes are not necessary.

Although generally one end of the coil 34 is connected to a high frequency power source and the other end of the coil 34 is grounded, the other end may also be used ungrounded (such as an antenna).

Sixth Embodiment

Next, the sixth embodiment of the present invention shall be explained with reference to FIG. 25.

Figure 25:
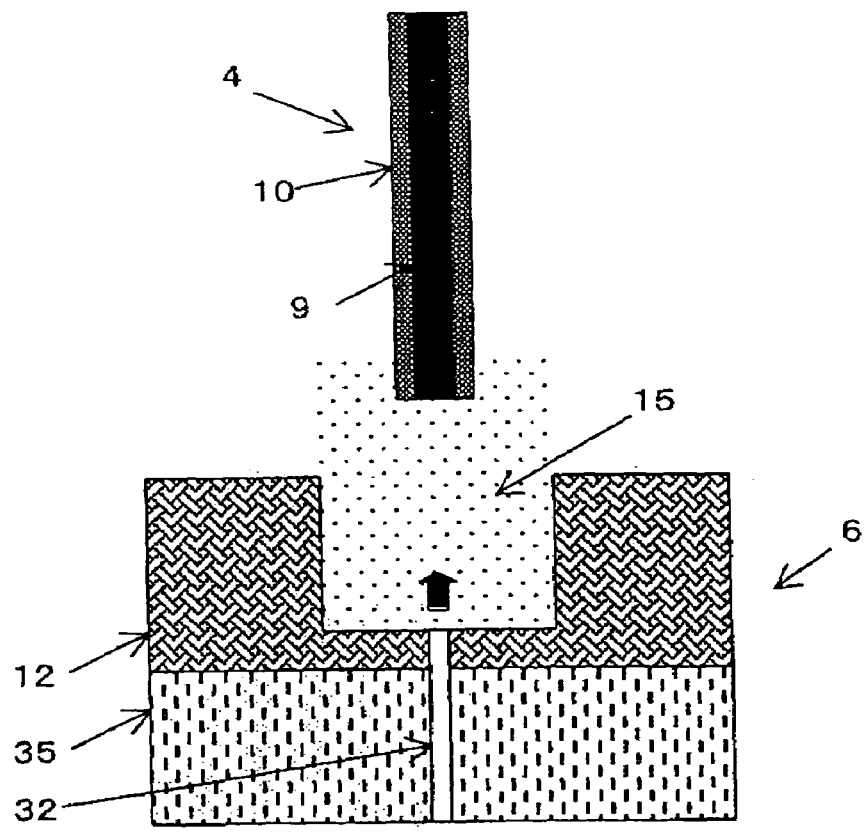
FIG. 25 is a cross-section diagram showing the outline structure of the microplasma source used in the sixth embodiment of the present invention.

FIG. 25 is a cross-section diagram showing an example of a microplasma source for irradiating a terminal section with plasma.

In FIG. 25, prior to plating, a section 4 which serves as a terminal section assumes the form of a coated wire in which the surface of a wire rod 9 having copper as a principal constituent is coated by a resin 10.

A microplasma source 6 includes a dielectric 12 having a concave portion, and an electrode 35. Gas is supplied to the concave portion of the dielectric 12 from a gas supply hole 32.

When the electrode 35 is impressed with a high frequency voltage, plasma 15 is generated in the concave portion of the dielectric 12. The voltage impressed on the electrode 35 can be a high frequency voltage of several hundred kHz to several GHz, a voltage having pulse modulated high frequency waves, or a pulsed direct current voltage.

In a structure such as this, there are cases where a strong stream-like electrical discharge arises between the electrode 35 and the wire rod 9, and if conditions are adjusted so that this does not change into an arc discharge, there is an advantage of being able to process at a very high speed.

Seventh Embodiment

Next, the seventh embodiment of the present invention shall be explained with reference to FIG. 26.

Figure 26:
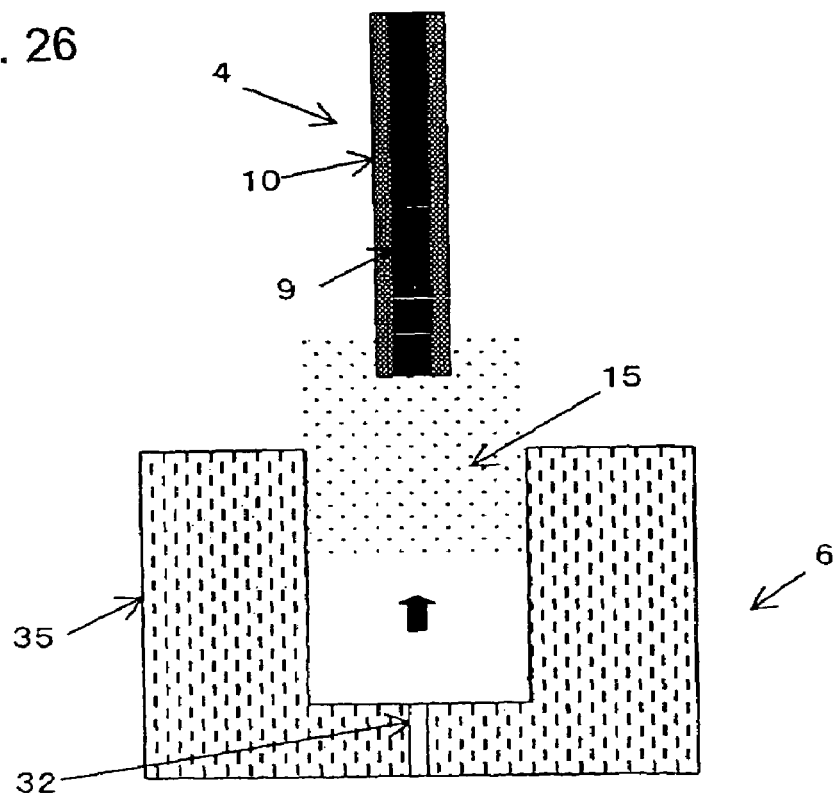
FIG. 26 is a cross-section diagram showing the outline structure of the microplasma source used in the seventh embodiment of the present invention.

FIG. 26 is a cross-section diagram showing an example of a microplasma source for irradiating a terminal section with plasma.

In FIG. 26, prior to plating, a section 4 which serves as a terminal section assumes the form of a coated wire in which the surface of a wire rod 9 having copper as a principal constituent is coated by a resin 10.

A microplasma source 6 is includes an electrode 35 having a concave portion. Gas is supplied to the concave portion of the electrode 35 from a gas supply hole 32.

When the electrode 35 is impressed with a high frequency voltage, plasma 15 is generated in the concave portion of the electrode 35. The voltage impressed on the electrode 35 can be a high frequency voltage of several hundred kHz to several GHz, a voltage having pulse modulated high frequency waves, or a pulsed direct current voltage.

In a structure such as this, there are cases where a strong stream-like electrical discharge arises between the electrode 35 and the wire rod 9, and if conditions are adjusted so that this does not change into an arc discharge, there is an advantage of being able to process at a very high speed.

Eighth Embodiment

Next, the eighth embodiment of the present invention shall be explained with reference to FIG. 27.

Figure 27:
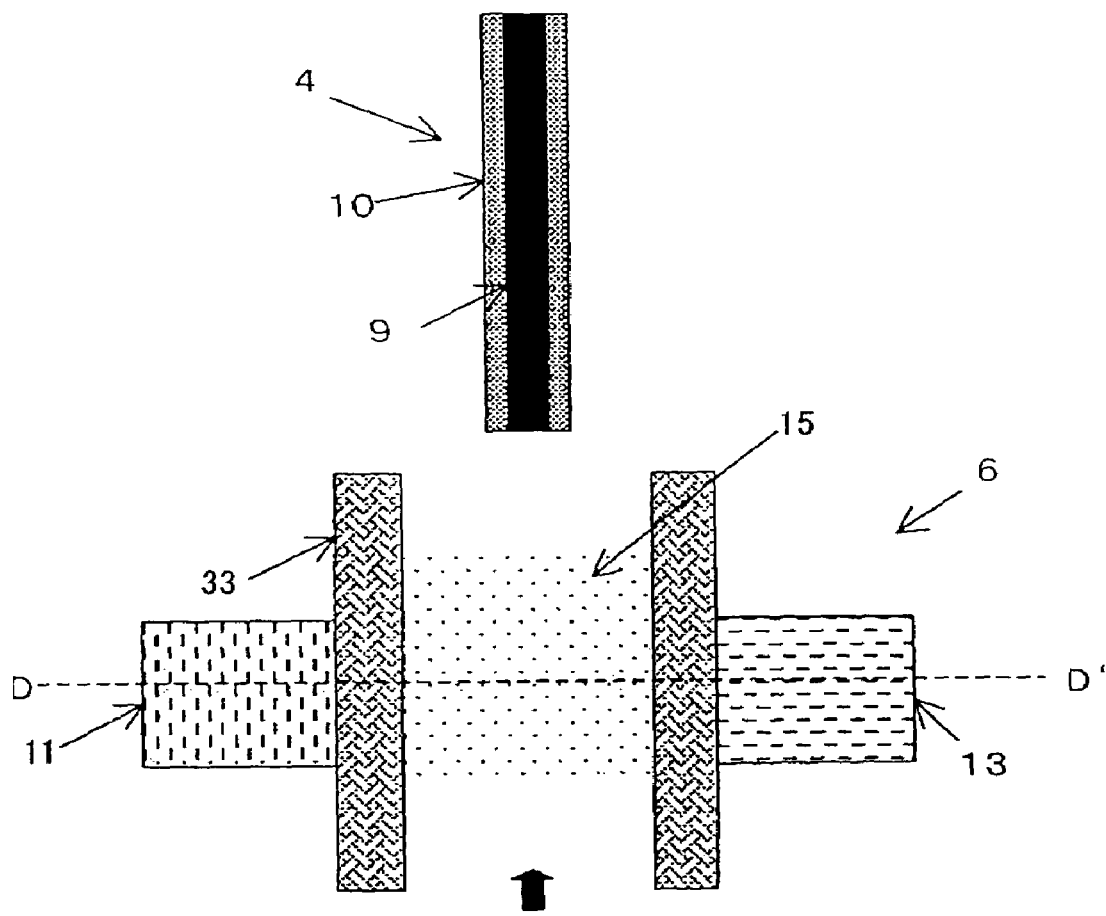
FIG. 27 is a cross-section diagram showing the outline structure of the microplasma source used in the eighth embodiment of the present invention.

FIG. 27 is a cross-section diagram of a microplasma source 6 and a section 4 which serves as a terminal section.

In FIG. 27, prior to plating, the section 4 which serves as a terminal section assumes the form of a coated wire in which the surface of a wire rod 9 having copper as a principal constituent is coated by a resin 10.

The microplasma source 6 includes a dielectric cylinder 33, and a first electrode 11 and a second electrode 13 that are located on opposite sides of the dielectric cylinder 33.

In addition, a gas supply apparatus (not shown) for supplying gas to the dielectric cylinder 33 and a power source (not shown) for supplying electrical power between the first and second electrodes 11 and 13 are connected to the microplasma source 6.

By supplying high frequency electric power of 13.56 MHz between the first electrode 11 and the second electrode 13, while supplying helium as the inert gas and $CF_4$ gas as the gas including oxygen and fluorine, from the bottom towards the top (i.e., in the direction of the arrow illustrated in FIG. 27) inside the dielectric cylinder 33, plasma 15 is generated inside the dielectric cylinder 33. Moreover, the cross-sectional shape of the dielectric cylinder 33 in the cross-section cut at D–D' in FIG. 27 is roughly circular, and is a structure which is suited to processing a single wire such as the coated wire.

The voltage impressed between the first electrode 11 and the second electrode 13 can be a high frequency voltage of several hundred kHz to several GHz, a voltage having pulse modulated high frequency waves, or a pulsed direct current voltage.

Although such a microplasma source 6 can operate from several Pa up to several atmospheres, the microplasma source 6 typically operates with a pressure ranging from about 10,000 Pa to 3 atmospheres. In particular, operation near atmospheric pressure is especially preferable as a tightly sealed structure and a special exhaust apparatus is not required, and diffusion of plasma and active particles is reasonably suppressed.

Figure 28:
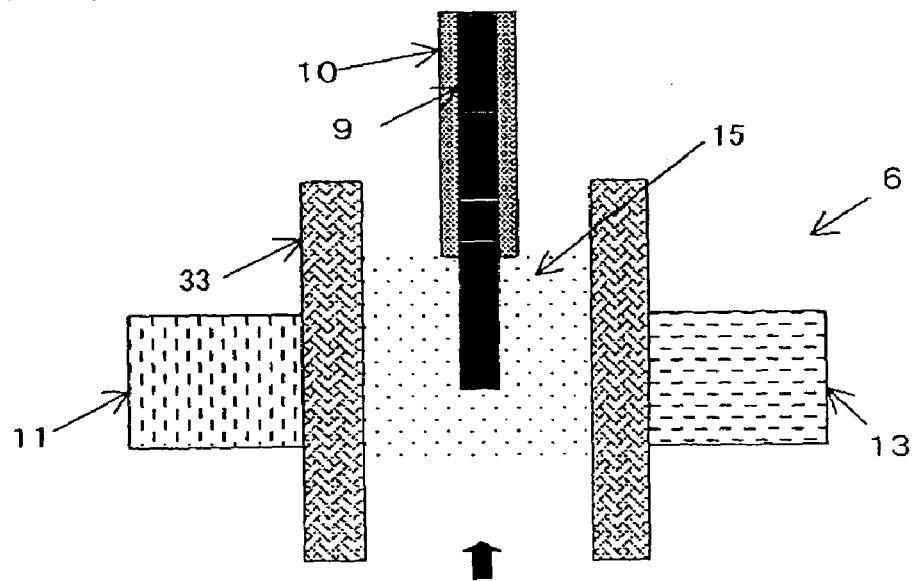
FIG. 28 is a cross-section diagram showing the appearance of the section serving as the terminal section being irradiated with plasma.

FIG. 28 is a cross-section diagram showing the appearance of the terminal section 4 being irradiated with plasma.

By operating a handler 5, the section 4 serving as the terminal section is inserted into the plasma 15 generated inside the dielectric cylinder 33, and is irradiated with the plasma 15. At which point, the active particles within the plasma 15 react with and vaporize the coating resin 10, exposing the wire rod 9 at the tip of the section 4 serving as the terminal section.

Although there is the advantage of discharging easily in inert gases at around atmospheric pressure, mixing a gas including oxygen or fluorine ($CF_4$, $SF_6$, and the like) has the advantage of enabling fast processing. A gas including fluorine disassociates in the plasma, giving rise to fluorine radicals. When a gas including fluorine is supplied, the coat-peeling process can be carried out significantly faster as compared to when a gas including fluorine is not supplied, as fluorine radicals produce the effect of making the extraction of H atoms easier when $CO_2$ and $H_2O$ are created by the reaction of oxygen radicals with the C and H atoms making up the coating material. However, as gases including fluoride are expensive as compared to inert gases such as helium, supplying only when the section 4 serving as the terminal section is inserted is also possible. Alternatively, it is also possible to supply gas and generate plasma, after the section 4 serving as the terminal section is inserted.

This type of plasma is referred to as non-equilibrium plasma. Although the temperature of electrons shouldering ionization is high, being in the tens of thousands degrees Celsius, the temperature of ions and neutral particles is low, being in the hundreds to thousands degrees Celsius, and there is an advantage of effectively vaporizing only the coating resin 10 with very little thermal/mechanical damage to the wire rod 9. Furthermore, assuming that the terminal section is processed using the plasma cleaning apparatus shown in the conventional example, only the resin on a part of the periphery of the terminal section is removed. Therefore, in the present embodiment, it is significantly better in terms of being able to remove the resin 10 around the entire periphery of the wire rod 9.

Figure 29:
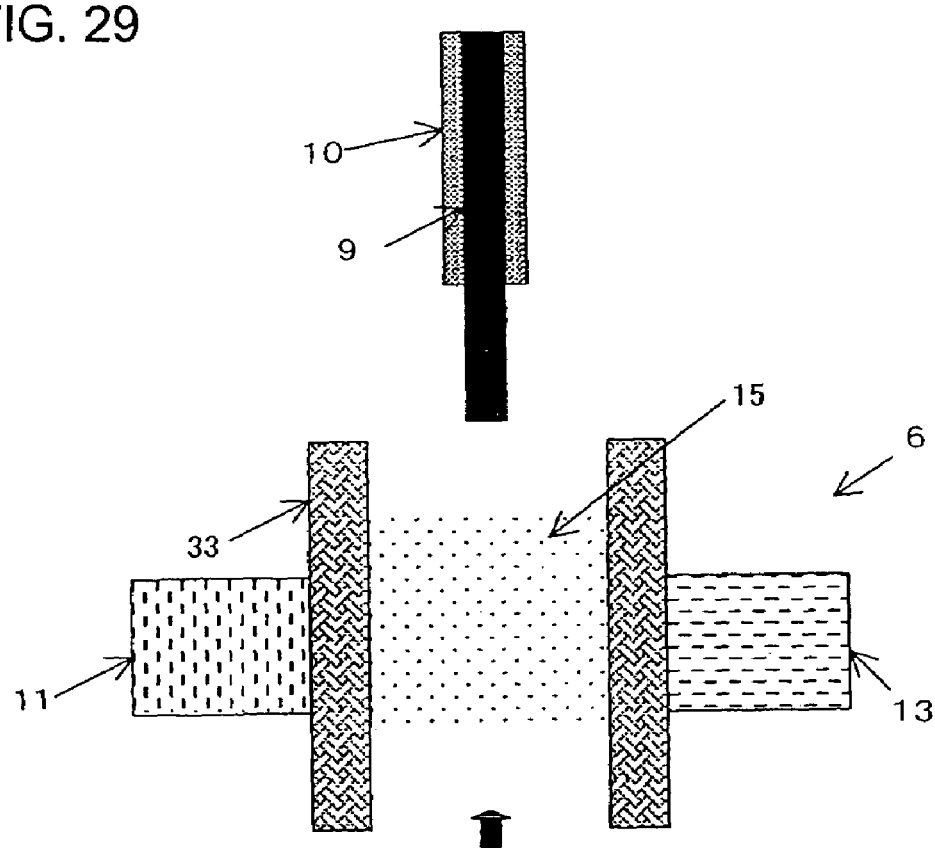
FIG. 29 is a cross-section diagram of the appearance of the section serving as the terminal section being drawn from the microplasma source.

Next, as shown in FIG. 29, the section 4 serving as the terminal section is withdrawn by operating the handler 5. Although dependent on processing conditions such the material of the wire rod, temperature, oxygen and water vapor density, generally, an ultra-thin natural oxide film develops on the surface of the exposed wire rod 9 at this time. Its thickness is generally under 20 nm, and is roughly about 2 nm to 10 nm. In particular, as the coating can be removed at a low temperature in the case of processing with plasma that uses a mixed gas of helium and a gas including oxygen and fluorine, the natural oxide film becomes extremely thin, and there is a big advantage of not requiring flux in the subsequent solder plating process.

Ninth Embodiment

Next, the ninth embodiment of the present invention shall be explained with reference to FIG. 30 and FIG. 31.

Figure 30:
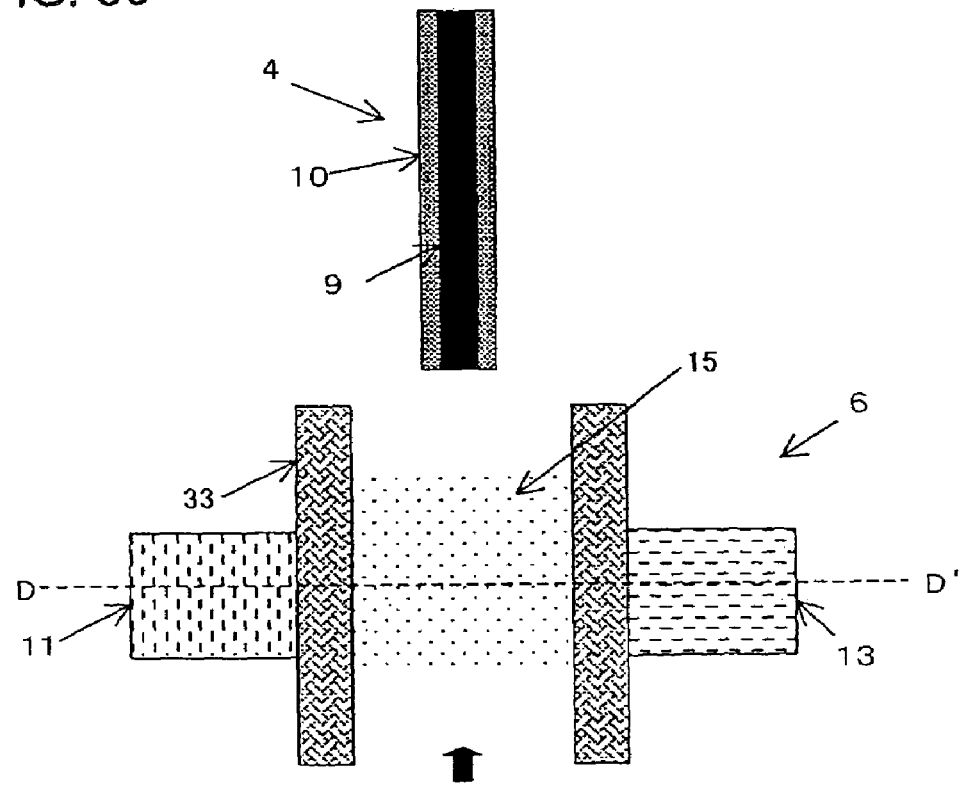
FIG. 30 is a cross-section diagram showing the outline structure of the microplasma source used in the ninth embodiment of the present invention.

FIG. 30 is a cross-section diagram of a microplasma source 6 and a section 4 which serves as a terminal section.

Prior to plating, a section 4 which serves as a terminal section assumes the form of a coated wire in which the surface of a wire rod 9 having copper as a principal constituent is coated by a resin 10.

The microplasma source 6 includes a dielectric cylinder 33, a gas supply apparatus (not shown), which is structured from a first electrode 11 and a second electrode 13 that are located on opposite sides of the dielectric cylinder 33, for supplying gas to the dielectric cylinder 33, and a power source (not shown) for supplying electrical power between the firs and second electrodes 11 and 13.

By supplying a high frequency electric power of 13.56 MHz between the first electrode 11 and the second electrode 13, while supplying helium as the inert gas, and $CF_4$ gas as the gas including oxygen and fluorine, from the bottom towards the top (i.e., in the direction of the arrow illustrated in FIG. 30) inside the dielectric cylinder 33, plasma 15 is generated inside the dielectric cylinder 33.

Moreover, the cross-sectional shape of the dielectric cylinder 33 in the cross-section cut at D–D' in FIG. 30 is roughly rectangular, and is a structure which is suited to processing a stranded wire made of a plurality of coated wires.

Figure 31:
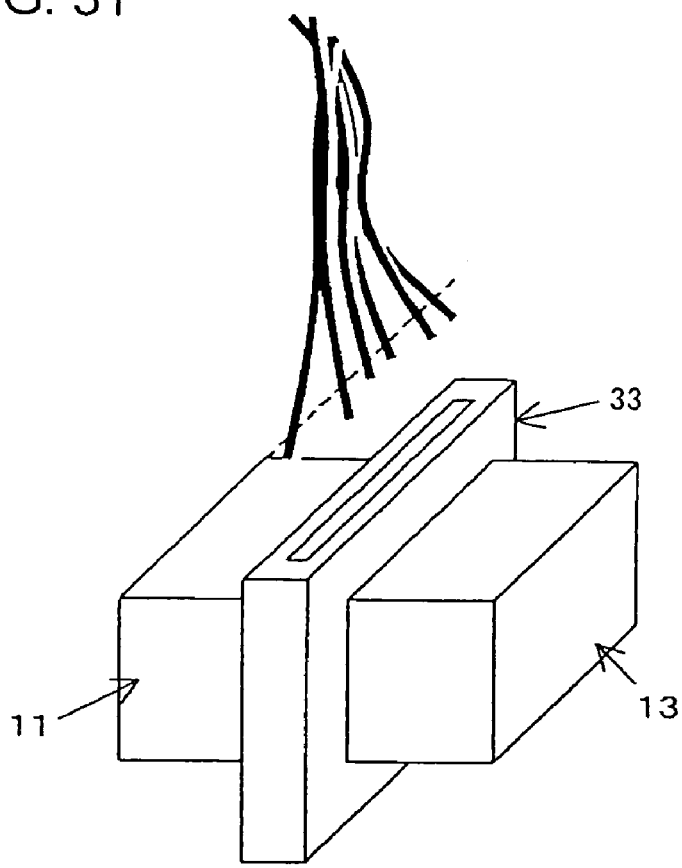
FIG. 31 is a diagram of a procedure of unbinding a stranded wire made of a plurality of coated wires and inserting the unbound wires into a dielectric cylinder according to the ninth embodiment of the present invention.

In other words, as shown in FIG. 31, by unbinding the tip of the stranded wire and laying out each of the coated wires so as to arrange the wires in a roughly linear manner, as in a dotted line, and inserting the unbound wires into the dielectric cylinder 33, it is possible to remove the coating faster than in the case where the stranded wire is inserted into a larger dielectric cylinder 33 without being unbound.

The voltage impressed between the first electrode 11 and the second electrode 13 can be a high frequency voltage of several hundred kHz to several GHz, a voltage having pulse modulated high frequency waves, or a pulsed direct current voltage.

Although such a microplasma source 6 can operate from several Pa up to several atmospheres, the microplasma source 6 typically operates with a pressure ranging from about 10,000 Pa to 3 atmospheres. In particular, operation near atmospheric pressure is especially preferable as a tightly sealed structure and a special exhaust apparatus is not required, and diffusion of plasma and active particles is reasonably suppressed.

Tenth Embodiment

Next, the tenth embodiment of the present invention shall be explained with reference to FIG. 32.

Figure 32:
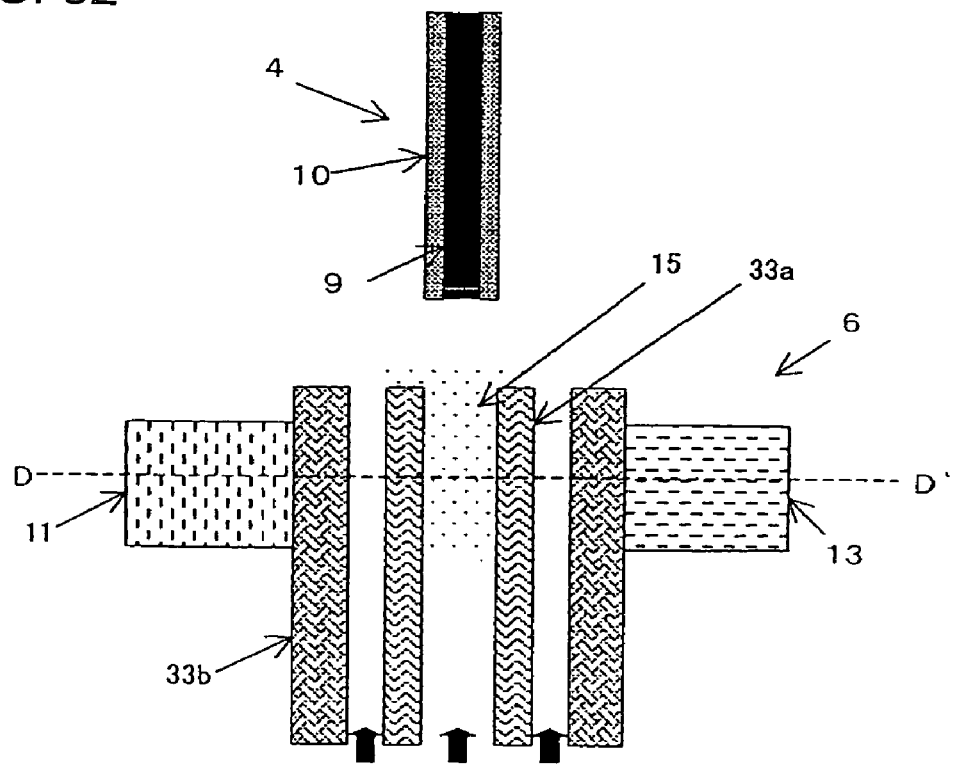
FIG. 32 is a cross-section diagram showing the outline structure of the microplasma source used in the tenth embodiment of the present invention.

FIG. 32 is a cross-section diagram showing an example of a microplasma source for irradiating a terminal section with plasma.

In FIG. 32, prior to plating, a section 4 which serves as a terminal section assumes the form of a coated wire in which the surface of a wire rod 9 having copper as a principal constituent is coated by a resin 10.

A microplasma source 6 includes a two-layered dielectric cylinder 33 made of an inner cylinder 33a and an outer cylinder 33b which are separated by a space. Plasma is generated by supplying an inert gas from one of the inner cylinder 33a and the outer cylinder 33b, supplying a gas including oxygen and fluorine from the other cylinder, and supplying electric power between a first electrode 11 and a second electrode 13 that are located on opposite sides of the outer cylinder 33b. Furthermore, the lengths of the inner cylinder 33a and the outer cylinder 33b downstream of the gas flow are generally the same, and the terminal section 4 is irradiated with plasma by being placed downstream of the dielectric cylinder.

FIG. 32 shows the appearance of plasma 15 being generated in the case where helium gas is supplied in the inner cylinder 33a as the inert gas, and $CF_4$ gas is supplied in the outer cylinder 33b as the gas including oxygen and fluorine.

As plasma is generated only in a region where helium gas density is sufficiently high, plasma is not generated in between the inner wall of the outer cylinder 33b and the outer wall of the inner cylinder 33a. However, as a mixing of helium gas and oxygen as well as $CF_4$ gas occurs at the periphery of the plasma, and active oxygen radicals and fluorine radicals develop in the downstream region of the dielectric cylinder 33, the coating can be peeled off very rapidly.

As plasma is generated inside the dielectric cylinder 33 in which a gas which mixes a gas including oxygen and fluorine into helium flows, in the embodiment discussed previously, plasma density is lower as compared to plasma generated with helium only, and as compared with the present embodiment, a tendency for processing speed to be slightly slower is recognized.

Moreover, the cross-sectional shape of the dielectric cylinder 33 in the cross-section cut at D–D' in FIG. 32 is roughly circular, and is a structure which is suited to processing a single wire such as the coated wire.

On the other hand, by making the cross-sectional shape of the dielectric cylinder in the cross-section cut at D–D' in FIG. 32 roughly rectangular, it is also possible to have a structure which is suited to processing a stranded wire made of a plurality of coated wires. In other words, by unbinding the tip of the stranded wire and laying out each of the coated wires so as to arrange the wires in a roughly linear manner, as in a dotted line, and inserting the unbound wires into the dielectric cylinder 33, it is possible to remove the coating faster than in the case where the stranded wire is inserted into a larger dielectric cylinder 33 without being unbound.

Eleventh Embodiment

Next, the eleventh embodiment of the present invention shall be explained with reference to FIG. 33.

Figure 33:
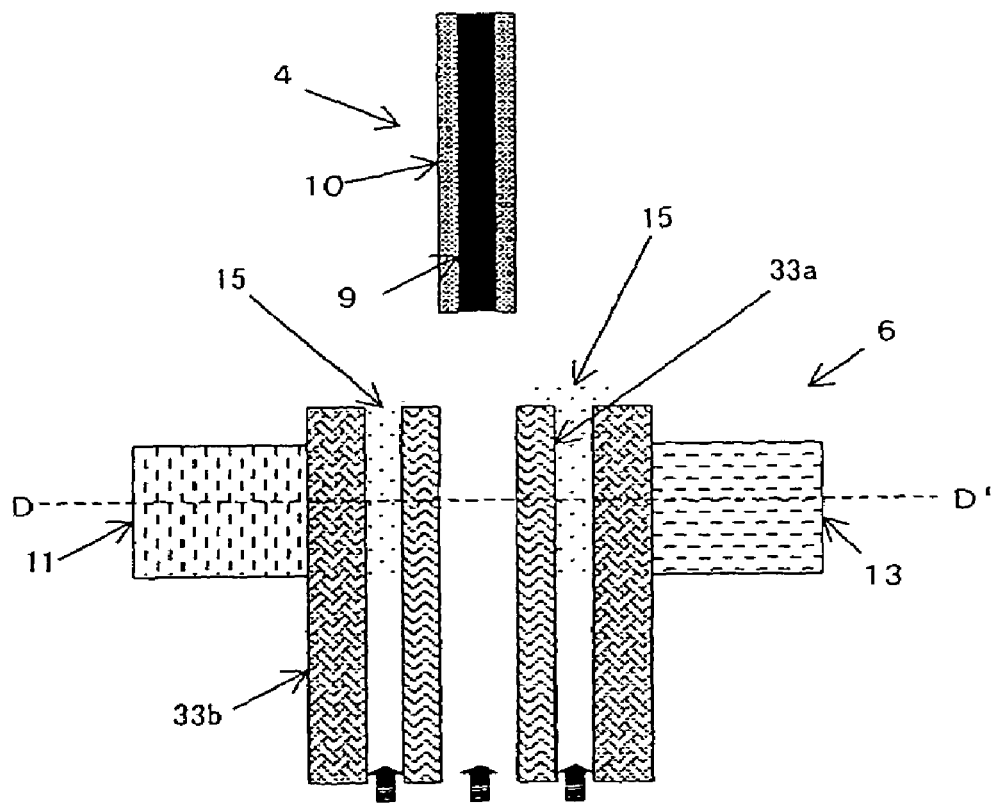
FIG. 33 is a cross-section diagram showing the outline structure of the microplasma source used in the eleventh embodiment of the present invention.

FIG. 33 is a cross-section diagram showing an example of a microplasma source for irradiating a terminal section with plasma.

In FIG. 33, prior to plating, a section 4 which serves as a terminal section assumes the form of a coated wire in which the surface of a wire rod 9 having copper as a principal constituent is coated by a resin 10.

A microplasma source 6 includes a two-layered dielectric cylinder 33 made of an inner cylinder 33a and an outer cylinder 33b which are separated by a space. Plasma is generated by supplying an inert gas from one of the inner cylinder 33a and the outer cylinder 33b, supplying a gas including oxygen and fluorine from the other cylinder, and supplying electric power between a first electrode 11 and a second electrode 13 that are located at opposite sides of the outer cylinder 33b. Furthermore, the lengths of the inner cylinder 33a and the outer cylinder 33b downstream of the gas flow are generally the same, and the terminal section 4 is irradiated with plasma by being placed downstream of the dielectric cylinder.

FIG. 33 shows the appearance of plasma 15 being generated in the case where $CF_4$ gas is supplied in the inner cylinder 33a as the gas including oxygen and fluorine, and helium gas is supplied in the outer cylinder 33b as the inert gas. As plasma is generated only in a region where helium gas density is sufficiently high, plasma is not generated inside the inner cylinder 33a. However, as a mixing of helium gas and oxygen as well as $CF_4$ gas occurs in the periphery of the plasma (inside area of ring-shaped plasma), and active oxygen radicals and fluorine radicals develop in the downstream region of the dielectric cylinder 33, the coating can be peeled off very rapidly.

As plasma is generated inside the dielectric cylinder in which a gas which mixes a gas including oxygen and fluorine in helium flows, in the previously discussed embodiment, plasma density is lower as compared to plasma generated with helium only. Compared with the present embodiment, a tendency for processing speed to be slightly slower is recognized.

Moreover, the cross-sectional shape of the dielectric cylinder 33 in the cross-section cut at D–D' in FIG. 33 is roughly circular, and is a structure which is suited to processing a single wire such as the coated wire. On the other hand, by making the cross-sectional shape of the dielectric cylinder 33 in the cross-section cut at D–D' in FIG. 33 roughly rectangular, it is also possible to have a structure which is suited to processing a stranded wire made of a plurality of coated wires. In other words, by unbinding the tip of the stranded wire and laying out each of the coated wires so as to arrange the wires in a roughly linear manner as in a dotted line, and inserting the unbound wires into the dielectric cylinder 33, it is possible to remove the coating faster than in the case where the stranded wire is inserted into a larger dielectric cylinder 33 without being unbound.

Twelfth Embodiment

Next, the twelfth embodiment of the present invention shall be explained with reference to FIG. 34 and FIG. 35.

Figure 34:
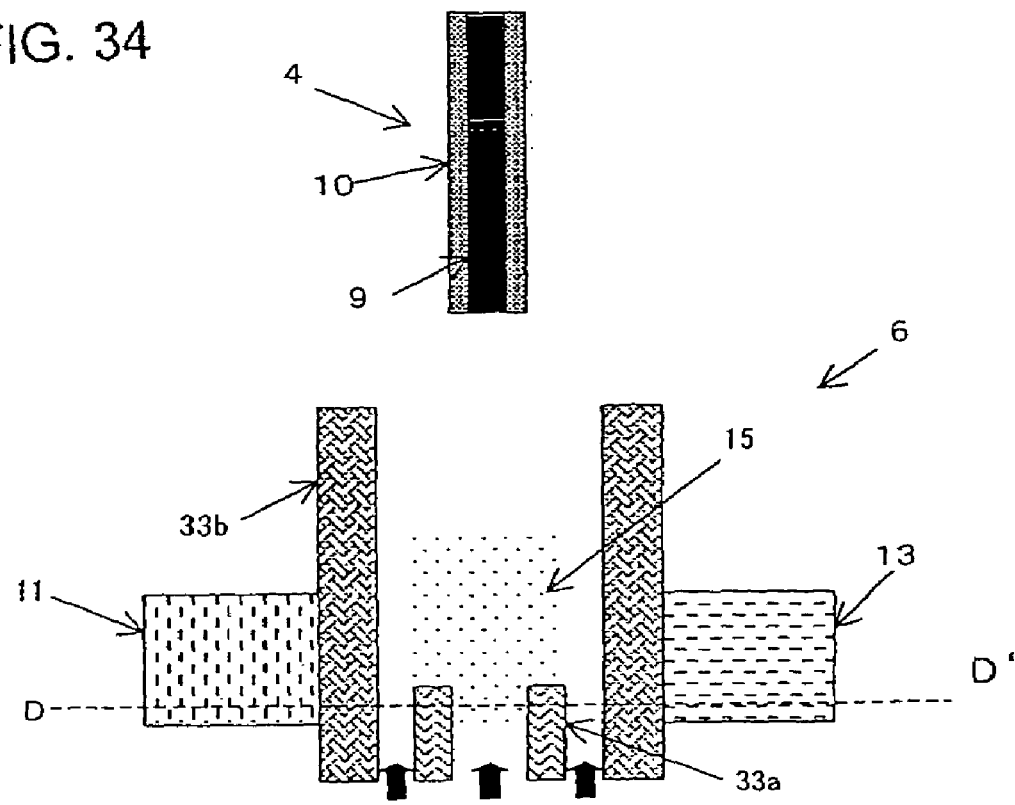
FIG. 34 is a cross-section diagram showing the outline structure of the microplasma source used in the twelfth embodiment of the present invention.

FIG. 34 is a cross-section diagram showing an example of a microplasma source for irradiating a terminal section with plasma.

In FIG. 34, prior to plating, a section 4 which serves as a terminal section assumes the form of a coated wire in which the surface of a wire rod 9 having copper as a principal constituent is coated by a resin 10.

A microplasma source 6 includes a two-layered dielectric cylinder 33 made from and inner cylinder 33a and an outer cylinder 33b which are separated by a space. Plasma is generated by supplying an inert gas from one of the inner cylinder 33a and the outer cylinder 33b, supplying a gas including oxygen and fluorine from the other cylinder, and supplying electric power between a first electrode 11 and a second electrode 13 that are located at opposite sides of the outer cylinder 33b. Furthermore, the length of the inner cylinder 33a is shorter than the length of the outer cylinder 33b downstream of the gas flow, and the terminal section 4 is irradiated with plasma by being inserted at a position that is inside the outer cylinder 33b and downstream from the gas emission port of the inner cylinder 33a.

FIG. 34 shows the appearance of the terminal section 4 prior to insertion. FIG. 35 shows the appearance of the inserted terminal section 4.

Figure 35:
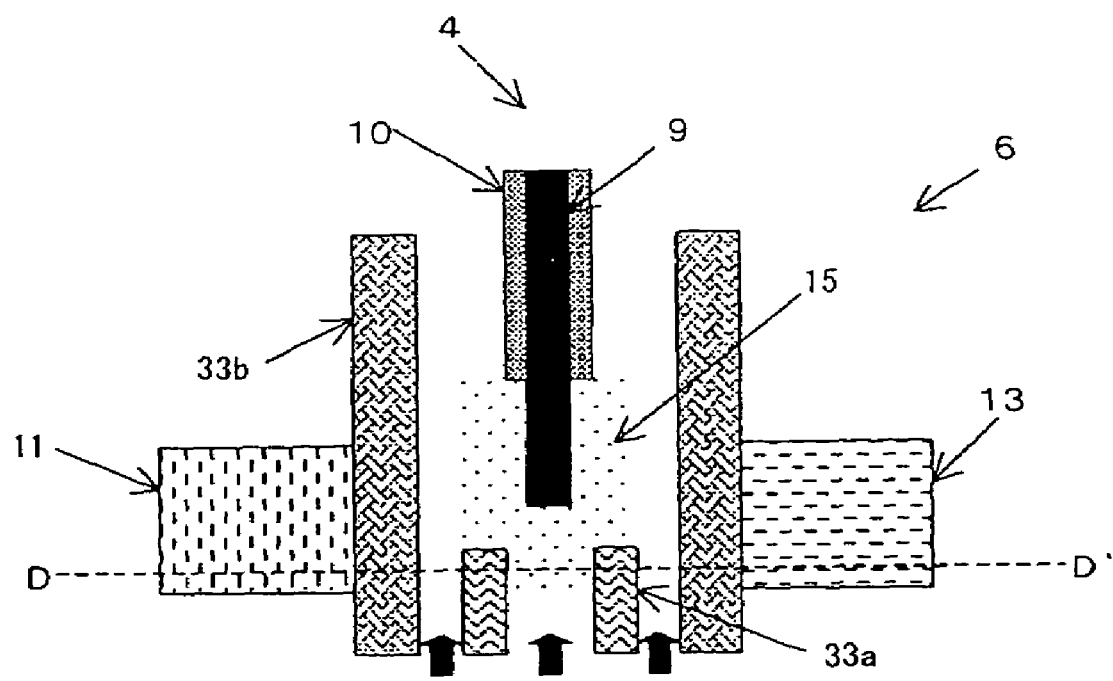
FIG. 35 is a cross-section diagram showing the appearance of the section serving as the terminal section being irradiated with plasma.

FIG. 34 and FIG. 35 show the appearance of plasma 15 being generated in the case where helium gas is supplied in the inner cylinder 33a as the inert gas, and $CF_4$ gas is supplied in the outer cylinder 33b as the gas including oxygen and fluorine. As plasma is generated only in a region where helium gas density is sufficiently high, plasma is not generated in between the inside wall of the outer cylinder 33b and the outer wall of the inner cylinder 33a. However, as a mixing of helium gas and oxygen as well as $CF_4$ gas occurs in the periphery of the plasma in the area which is downstream of the inner cylinder 33a and in the inner part of the outer cylinder 33b, and active oxygen radicals and fluorine radicals are generated, the coating can be peeled off very rapidly. As plasma is generated inside the dielectric cylinder in which a gas which mixes a gas including oxygen and fluorine in helium flows, in the previously discussed embodiment, plasma density is lower as compared to plasma generated with helium only. Compared with the present embodiment, a tendency for processing speed to be slightly slower is recognized.

Moreover, the cross-sectional shape of the dielectric cylinder in the cross-section cut at D–D' in FIG. 34 is roughly circular, and is a structure which is suited to processing a single wire such as the coated wire.

On the other hand, by making the cross-sectional shape of the dielectric cylinder 33 in the cross-section cut at D–D' in FIG. 34 roughly rectangular, it is also possible to have a structure which is suited to processing a stranded wire made of a plurality of coated wires. In other words, by unbinding the tip of the stranded wire and laying out each of the coated wires so as to arrange the wires in a roughly linear manner as in a dotted line, and inserting the unbound wires into the dielectric cylinder 33, it is possible to remove the coating faster than in the case where the stranded wire is inserted into a larger dielectric cylinder 33 without being unbound.

Moreover, in the case where $CF_4$ gas is supplied in the inner cylinder 33a as the gas including oxygen and fluorine, and helium gas is supplied in the outer cylinder 33b as the inert gas, plasma is not generated inside the inner cylinder 33a. As mixing of helium gas and oxygen as well as $CF_4$ gas occurs in the periphery of the plasma (inside area of ring-shaped plasma), and active oxygen radicals and fluorine radicals develop in the region downstream of the inner cylinder 33a, the coating can be peeled off very rapidly.

Although several structural examples of the plasma source are shown in the previously discussed embodiments of the present invention, various plasma sources can be used.

Furthermore, by supplying direct current voltage or high frequency electric power to the wire rod during processing in the microplasma source, it also becomes possible to strengthen the action of drawing the ions within the plasma. In this case, there is an advantage of increased processing speed.

Furthermore, although the case of plating the terminal section with a solder having a 0.10% lead content is exemplified, the present invention can provide electrical parts that are plated with solder having a lead content below 1%. By using electronic parts such as this, it is possible to substantially decrease the mixing-in of lead into the dip tank inside the solder reflow apparatus. However, in order to further decrease the mixing-in of lead into the dip tank inside the solder reflow apparatus, it is preferable that the lead content of the solder be below 0.5%, and further preferable if the lead content of the solder is below 0.3%.

Furthermore, after the resin coating of the wire rod is removed by using microplasma, it is also possible to apply flux to the terminal section, and then plate the terminal section with a solder having a low lead content. With this type of processing, it is possible to obtain a terminal section having a high degree of reliability.

Furthermore, the present invention produces exceptional effects particularly in the case where the diameter of the wire rod making up the terminal section is from $\phi 0.01$ mm to $\phi 0.1$ mm, inclusive. Handling of wire rods having a diameter under $\phi 0.01$ mm is difficult, and the processes described in the present invention are not suitable. On the other hand, in the case where the wire diameter is greater than 0.1 mm, it is also possible to pare off the resin coating by using a bladed tool, and plasma processing may not always be necessary. However, as scrapings arise in the process of paring off the coating, causing deterioration of the operating environment, there are also cases where the application of the present environment is preferable even in the case where the wire diameter is greater than 0.1 mm.

Furthermore, although the case where the lead content of the solder in the solder dip tank of the solder reflow apparatus is 0.1% is exemplified, the present invention produces exceptional effects in the case where the lead content of the solder in the solder dip tank of the solder reflow apparatus is below 1%. This is due to the particular sensitivity to mixing-in of lead from the terminal section in such a case where lead content is low.

Furthermore, it is possible to perform the series of processes in a short period of time, by constructing, as the processing apparatus for electronic parts having a terminal section, a processing apparatus which includes a coil winder, a microplasma source, a gas supply apparatus for supplying gas to the microplasma source, a power source for supplying electric power to the microplasma source or the terminal section of the electronic part, a solder plating tank, a heater for heating the solder plating tank, and a solder reflow apparatus.

Furthermore, the present invention can also be applied even in a coil having a terminal post, as another embodiment of the coil.

Furthermore, it is preferable that the size of the dielectric cylinder be from 0.1 mm to 10 mm, inclusive, in diameter. A dielectric cylinder having a diameter of less than 0.1 mm bears manufacturing difficulties. In addition, when a dielectric cylinder with a diameter of over 10 mm is used, generation of high density plasma under atmospheric pressure becomes difficult. It is even more preferable that the size of the dielectric cylinder be from 0.3 mm to 3 mm, inclusive, in diameter.

Furthermore, in the case where plasma processing is carried out by using one dielectric cylinder, it is preferable that the percentage of inert gas be from 90% to 99.9%, inclusive. When the percentage of inert gas is under 90%, plasma density deteriorates excessively, resulting in the inconvenience of not being able to obtain sufficient processing speed. On the contrary, when the percentage of inert gas exceeds 99.9%, the percentage of the gas including oxygen and fluorine is too low, and high speed peeling of the coating becomes difficult. It is even more preferable that the percentage of inert gas be from 95% to 99%, inclusive.

Furthermore, although the case using helium gas as the inert gas is exemplified, it is also possible to use a gas mixed with an inert gas such as helium, argon, xenon, with the inert gas preferably having a principal constituent of helium gas.

Furthermore, although the case where $CF_4$ is used as the gas including fluorine is exemplified, $SF_6$ can also be used. $SF_6$ has the advantage of disassociating easily and generating a large amount of fluorine radicals. It is also possible to use other fluorocarbon gases such as HF and $C_2F_6$, $C_4F_8$.

Furthermore, in the case where a two-layered dielectric cylinder is used, it is preferable that the percentage of the inert gas be from 20% to 80%, inclusive. When the percentage of inert gas is under 20%, plasma density deteriorates excessively, resulting in the inconvenience of not being able to obtain sufficient processing speed. On the contrary, when the percentage of inert gas exceeds 80%, the percentage of the gas including oxygen and fluorine is too low, and high speed peeling of the coating becomes difficult.

Furthermore, by properly adjusting the conditions during the removal of the resin coating the wire rod by using microplasma, it is possible to form minute depressions and projections on the surface of the wire rod from which the resin has been removed. Lead-free solder, which is more prone to slippage than leaded solder, is able to attach more easily to such a minutely uneven surface, and it becomes possible to form a terminal section with a high degree of reliability.

Furthermore, the present invention can be applied even when the terminal section is that of a stranded wire made up of a plurality of wire rods. Even when microplasma processing is carried out on the stranded wire, as is, it is still possible to obtain the appropriate terminal condition as plasma is in a gaseous state and the active particles can be brought to act even in the gaps in the stranded wire.

Furthermore, although exemplification is made of the case where plasma processing is carried out on the terminal section after the coil serving as the electronic part is formed, it is also possible to form the coil after the process of peeling off the resin coating is carried out, not on the terminal section, but on an intermediate section of the coated wire.

In this case, a processing method is employed that can suitably use a plasma source having a through-hole along its entirety, and which includes irradiating, with plasma, a section of a coated wire which is a wire rod having copper as a principal constituent and a surface covered with a resin, cutting-off the wire rod at the irradiated section, and forming the coil by winding the cut-off coated wire in a predetermined shape.

The invention claimed is:

1. An electronic part processing method for peeling off a resin coating of an electronic part having a terminal section, said method comprising
irradiating a coated wire with plasma of oxygen and a gas including fluorine, under pressure ranging from 10,000 Pa to 3 atmospheres, the coated wire being a wire having copper as a principal constituent, a wire diameter of $\phi 0.01$ mm to 0.1 mm, and a surface coated with a resin.

2. The electronic part processing method according to claim 1, wherein the gas of the plasma irradiated in said irradiating of the coated wire with the plasma includes an inert gas.

3. The electronic part processing method according to claim 2, wherein a percentage of the inert gas included in the gas is from 90% to 99.9%.

4. The electronic part processing method according to claim 2, wherein the inert gas includes helium gas.

5. The electronic part processing method according to claim 1, wherein the fluorine is included as at least one of $CF_4$ and $SF_6$ gases.

6. The electronic part processing method according to claim 1, wherein the plasma is irradiated under atmospheric pressure.

7. The electronic part processing method according to claim 1, wherein in said irradiating of the coated wire with the plasma, the plasma is generated by supplying electric power between two electrodes, the electrodes being located opposite each other across a dielectric cylinder.

8. The electronic part processing method according to claim 1, wherein in said irradiating of the coated wire with the plasma, the plasma is generated by using a two-layered dielectric cylinder made of an inner cylinder and an outer cylinder which are separated by a space, in which an inert gas is supplied from one of the inner cylinder and the outer cylinder, and oxygen and a gas including fluorine is supplied from the other of the inner cylinder and the outer cylinder, and electric power is supplied between two electrodes located on opposite sides of the outer cylinder.

9. The electronic part processing method according to claim 8, wherein a percentage of the inert gas within a total of the gases supplied from the inner cylinder and the outer cylinder is from 20% to 80%.

10. The electronic part processing method according to claim 1, further comprising:
cutting-off a wire rod at a portion from which the resin coating has been peeled off by irradiation with the plasma; and
forming a coil by winding the coated wire including the cut-off wire rod, into a predetermined shape.

11. The electronic part processing method according to claim 1, further comprising forming the terminal section by plating solder onto a portion from which the resin coating has been peeled off by irradiation with the plasma, the solder having less than 1% lead content.

12. The electronic part processing method according to claim 11, further comprising applying flux onto the portion from which the resin coating has been peeled off by irradiation with the plasma.

13. The electronic part processing method according to claim 11, further comprising:
inserting the terminal section of the electronic part into a printed circuit board; and
soldering the terminal section of the electronic part onto the printed circuit board by processing the printed circuit board on a solder reflow apparatus.

14. The electronic part processing method according to claim 13, wherein the solder reflow apparatus shoots the solder onto the printed circuit board, the solder having less than 1% lead content.

15. The electronic part processing method according to claim 1, wherein said irradiating of the coated wire with the plasma is performed by introducing the terminal section of the electronic part into plasma that is only generated close to a tip of a cylindrical plasma generation source.

16. An electronic part processing apparatus for peeling off a resin coating of an electronic part having a terminal section, said electronic part processing apparatus comprising:

a microplasma source including a cylinder having a cylinder diameter of from 0.3 mm to 3 mm, inclusive, and operable to generate plasma locally;

a gas supply apparatus operable to supply gas to said microplasma source;

a power source operable to supply electric power to said microplasma source; and a coil winder operable to form a coil by winding a coated wire into a predetermined shape.

* * * * *